(12) United States Patent
Choi et al.

(10) Patent No.: US 12,272,702 B2
(45) Date of Patent: Apr. 8, 2025

(54) IMAGE SENSOR WITH 3×3 ARRAY PIXELS

(71) Applicant: Samsung Electronics Co., Ltd., Suwon-si (KR)

(72) Inventors: Yujung Choi, Yongin-si (KR); Junho Seok, Hwaseong-si (KR); Munhwan Kim, Seoul (KR); Wonchul Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 553 days.

(21) Appl. No.: 17/546,401

(22) Filed: Dec. 9, 2021

(65) Prior Publication Data

US 2022/0344393 A1 Oct. 27, 2022

(30) Foreign Application Priority Data

Apr. 26, 2021 (KR) ........................ 10-2021-0053916

(51) Int. Cl.
*H01L 27/146* (2006.01)
*H01L 27/148* (2006.01)

(52) U.S. Cl.
CPC .. *H01L 27/14612* (2013.01); *H01L 27/14603* (2013.01); *H01L 27/14621* (2013.01); *H01L 27/14636* (2013.01); *H01L 27/14643* (2013.01); *H01L 27/14831* (2013.01)

(58) Field of Classification Search
CPC ......... H01L 27/14612; H01L 27/14603; H01L 27/14621; H01L 27/14636; H01L 27/14643; H01L 27/14831; H01L 27/14605; H01L 27/1463; H01L 27/14609; H04N 25/11; H04N 25/766
See application file for complete search history.

(56) References Cited

U.S. PATENT DOCUMENTS

| | | | |
|---|---|---|---|
| 8,158,921 B2 | 4/2012 | McKee | |
| 9,467,637 B2 | 10/2016 | Lin et al. | |
| 10,218,927 B2 | 2/2019 | Kwag et al. | |
| 10,510,796 B1 | 12/2019 | Wang et al. | |
| 10,756,129 B2 | 8/2020 | Geurts | |

(Continued)

FOREIGN PATENT DOCUMENTS

| | | |
|---|---|---|
| KR | 1020190004089 A | 1/2019 |
| KR | 1020200095829 A | 8/2020 |
| KR | 1020210054092 A | 5/2021 |

*Primary Examiner* — Georgia Y Epps
*Assistant Examiner* — Monica T Taba
(74) *Attorney, Agent, or Firm* — Muir Patent Law, PLLC

(57) ABSTRACT

An image sensor including first and second pixel groups, each of which includes first to ninth pixels arranged to form a 3×3 array is disclosed. The image sensor further includes first to ninth transfer transistors disposed in each of the pixel groups to correspond to the first to ninth pixels, respectively, each of the first to ninth transfer transistors including a transfer gate and a floating diffusion region, a selection transistor disposed in at least one of the fourth to sixth pixels in each of the pixel group, and source follower transistors respectively disposed in at least two pixels of the first to third and seventh to ninth pixels in each of the pixel groups. Source follower gates of the source follower transistors may be connected to the floating diffusion region of each of the first to ninth transfer transistors.

19 Claims, 25 Drawing Sheets

(56) References Cited

U.S. PATENT DOCUMENTS

| | | | |
|---|---|---|---|
| 10,879,286 B2 | 12/2020 | Im et al. | |
| 2010/0182465 A1* | 7/2010 | Okita | H04N 25/00 |
| | | | 348/300 |
| 2018/0343404 A1* | 11/2018 | Hwang | H04N 25/59 |
| 2020/0321367 A1* | 10/2020 | Kobayashi | H01L 27/14605 |
| 2021/0136303 A1 | 5/2021 | Kim et al. | |

* cited by examiner

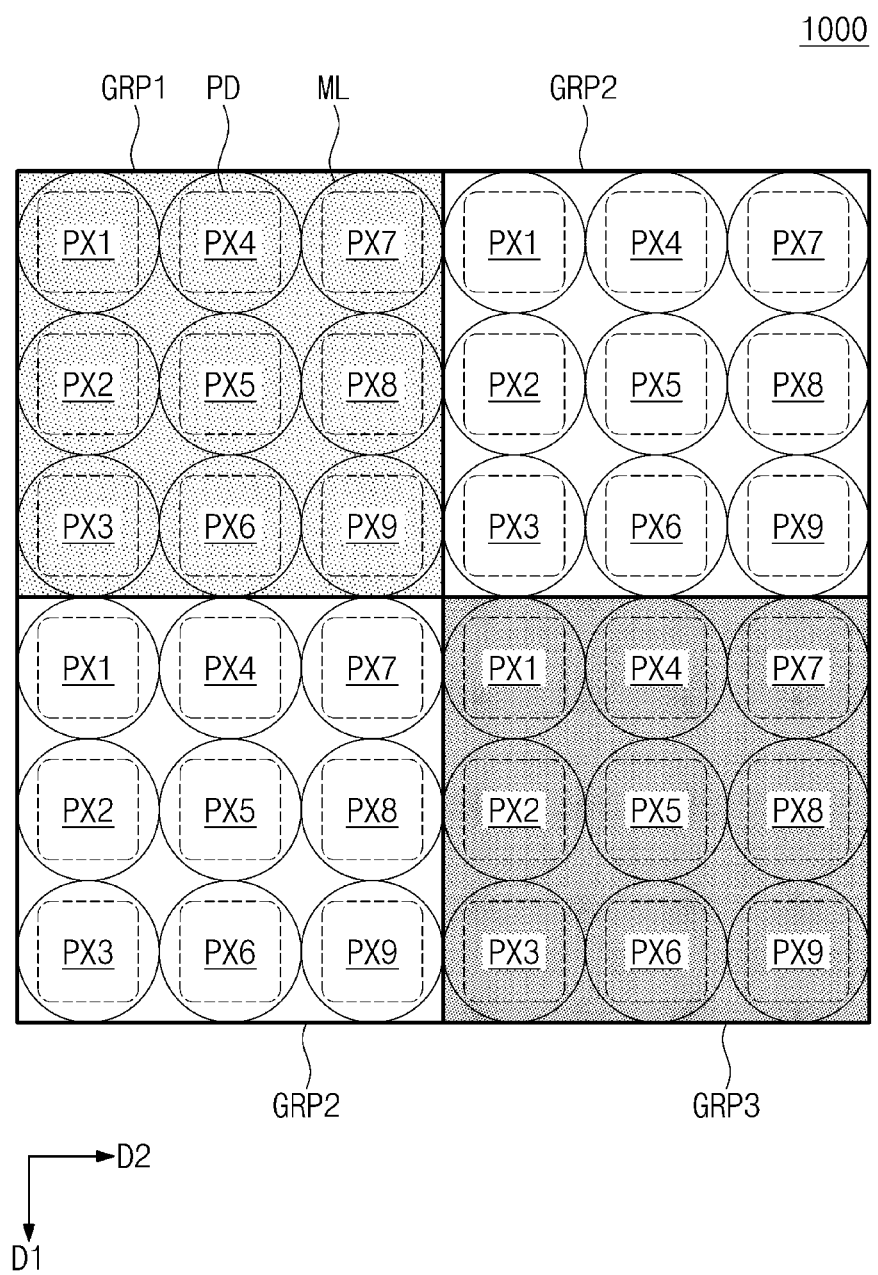

IMAGE SENSOR WITH 3×3 ARRAY PIXELS

CROSS-REFERENCE TO RELATED APPLICATIONS

This U.S. non-provisional patent application claims priority under 35 U.S.C. § 119 to Korean Patent Application No. 10-2021-0053916, filed on Apr. 26, 2021, in the Korean Intellectual Property Office, the entire contents of which are hereby incorporated by reference.

BACKGROUND OF THE INVENTION

The present disclosure relates to an image sensor, and in particular, to an image sensor having 3×3 array pixels.

An image sensor is a semiconductor device converting an optical image to electric signals. The image sensor is classified into two types: a charge coupled device (CCD) type and a complementary metal-oxide-semiconductor (CMOS) type. The CMOS-type image sensor is called CIS for short. The CIS includes a plurality of pixels that are two-dimensionally arranged. Each of the pixels includes a photodiode (PD). The photodiode is used to convert an incident light to an electric signal.

SUMMARY

An embodiment of the inventive concept provides an image sensor which includes 3×3 array pixels capable of reducing signal noise.

According to an embodiment of the inventive concept, an image sensor may include a substrate including a first pixel group and a second pixel group, which are directly adjacent to each other in a first direction, each of the first and second pixel groups including first to ninth pixels, which are arranged to form three rows in the first direction and three columns in a second direction, the first to third pixels constituting a first column, the fourth to sixth pixels constituting a second column, and the seventh to ninth pixels constituting a third column, first to ninth transfer transistors, which are disposed in each of the first and second pixel groups to correspond to the first to ninth pixels, respectively, each of the first to ninth transfer transistors including a transfer gate and a floating diffusion region, a selection transistor disposed in at least one of the fourth to sixth pixels in each of the first and second pixel groups, and source follower transistors respectively disposed in at least two pixels of the first to third pixels and the seventh to ninth pixels in each of the first and second pixel groups. Source follower gates of the source follower transistors may be connected to the floating diffusion region of each of the first to ninth transfer transistors.

According to an embodiment of the inventive concept, an image sensor may include a substrate including a first pixel group and a second pixel group, which are directly adjacent to each other in a first direction, each of the first and second pixel groups including first to ninth pixels, which are arranged to form three rows in the first direction and three columns in a second direction, the first to third pixels constituting a first column, the fourth to sixth pixels constituting a second column, and the seventh to ninth pixels constituting a third column, first to ninth transfer transistors, which are disposed in each of the first and second pixel groups to correspond to the first to ninth pixels, respectively, each of the first to ninth transfer transistors including a transfer gate and a floating diffusion region, a selection transistor disposed in at least one of the fourth to sixth pixels in each of the first and second pixel groups, and a dummy transistor disposed in at least one pixel of the first to third pixels and the seventh to ninth pixels in each of the first and second pixel groups.

According to an embodiment of the inventive concept, an image sensor may include a substrate including a first pixel group and a second pixel group, which are directly adjacent to each other in a first direction, each of the first and second pixel groups including first to ninth pixels, which are arranged to form three rows in the first direction and three columns in a second direction, the first to third pixels constituting a first column, the fourth to sixth pixels constituting a second column, and the seventh to ninth pixels constituting a third column, a deep device isolation structure disposed in the substrate to isolate the first to ninth pixels from each other and to isolate the first and second pixel groups from each other, first to ninth transfer transistors, which are disposed in each of the first and second pixel groups to correspond to the first to ninth pixels, respectively, each of the first to ninth transfer transistors including a transfer gate and a floating diffusion region, source follower transistors respectively disposed in at least two pixels of the first to third pixels and the seventh to ninth pixels in each of the first and second pixel groups, an interlayer insulating layer covering the first to ninth transfer transistors and the source follower transistors, a first connection line disposed on the interlayer insulating layer to connect source follower gates of the source follower transistors to the floating diffusion region of each of the first to ninth transfer transistors, and a first color filter and a second color filter, which cover the first and second pixel groups, respectively, and have different colors from each other.

BRIEF DESCRIPTION OF THE DRAWINGS

FIG. 3 is a plan view illustrating an image sensor according to an embodiment of the inventive concept.

DETAILED DESCRIPTION

Example embodiments of the inventive concepts will now be described more fully with reference to the accompanying drawings, in which example embodiments are shown. It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Figure 1A:
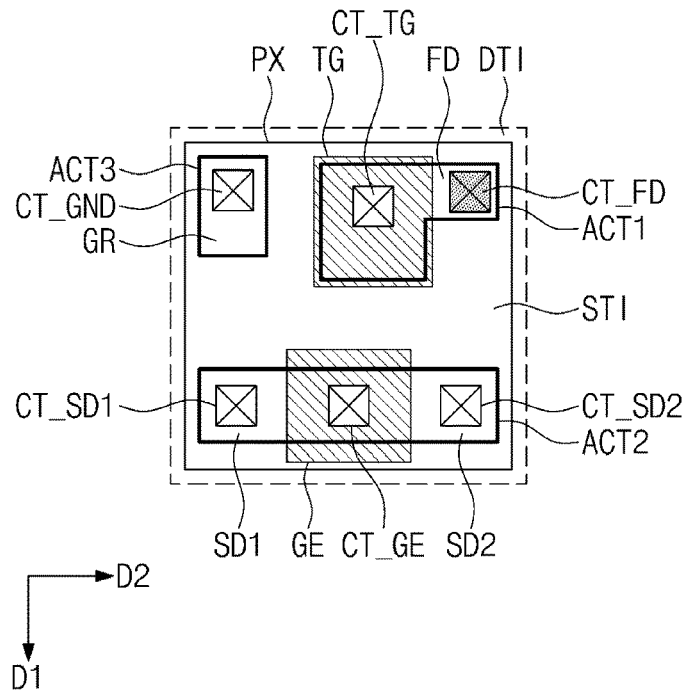
FIGS. 1A and 1B are plan views illustrating a pixel of an image sensor according to an embodiment of the inventive concept.
Figure 1B:
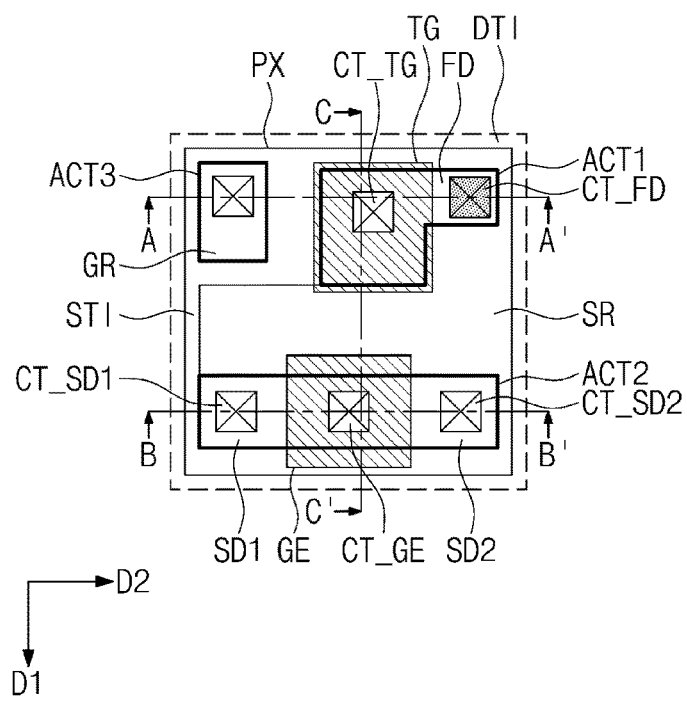
Figure 2A:
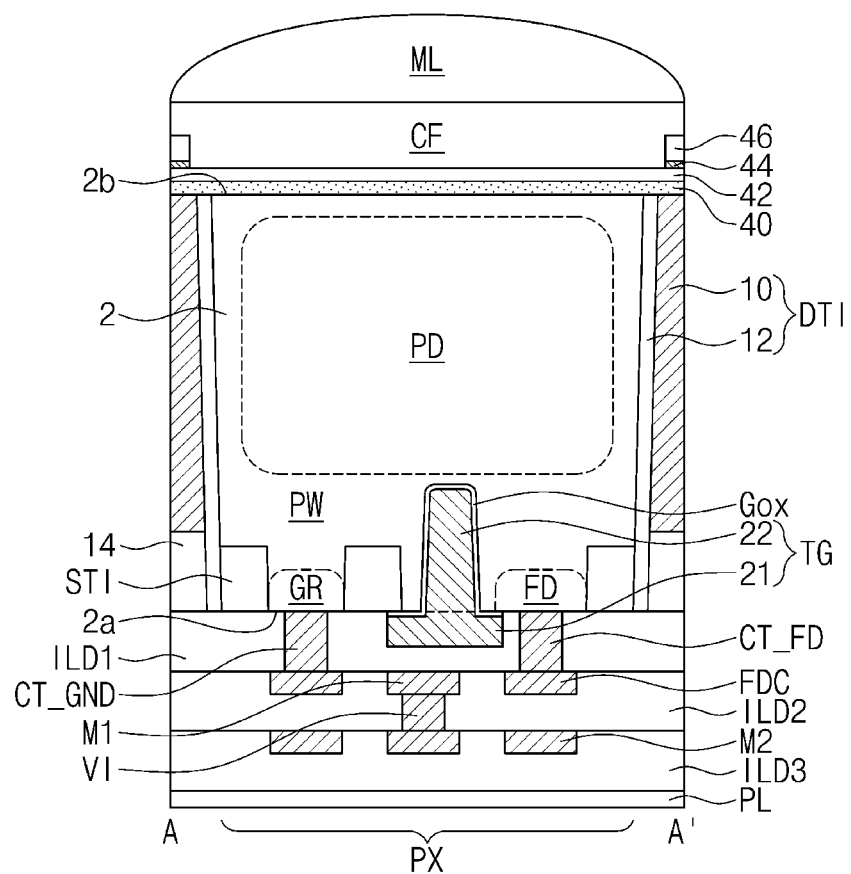
FIGS. 2A to 2C are sectional views taken along lines A-A', B-B', and C-C' of FIG. 1B.
Figure 2B:
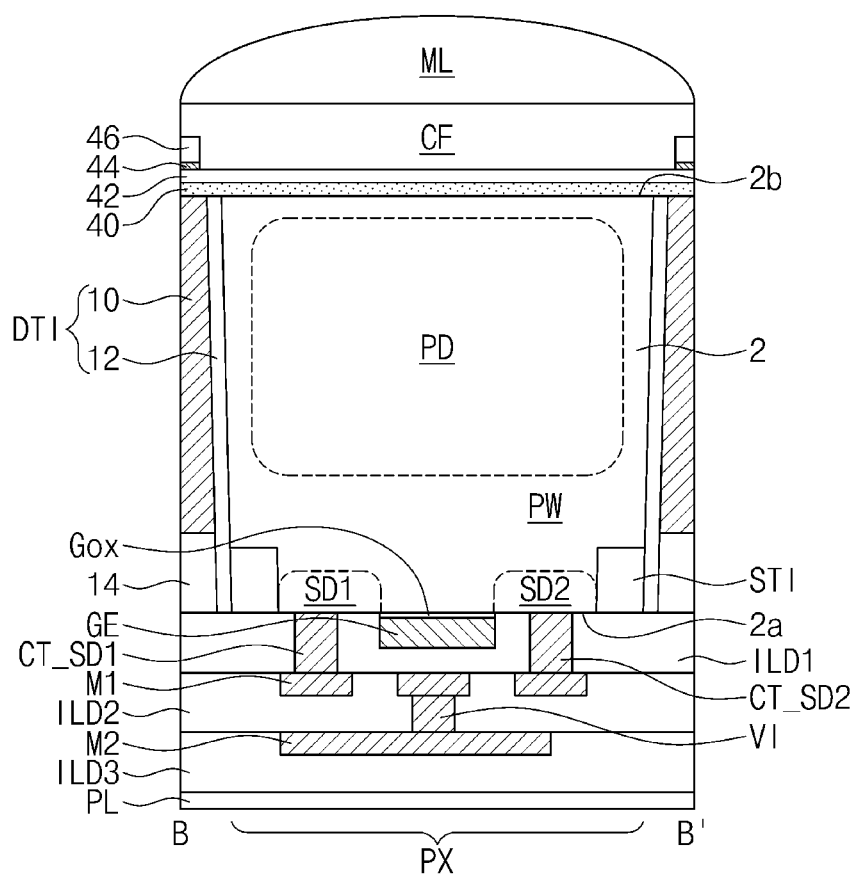
Figure 2C:
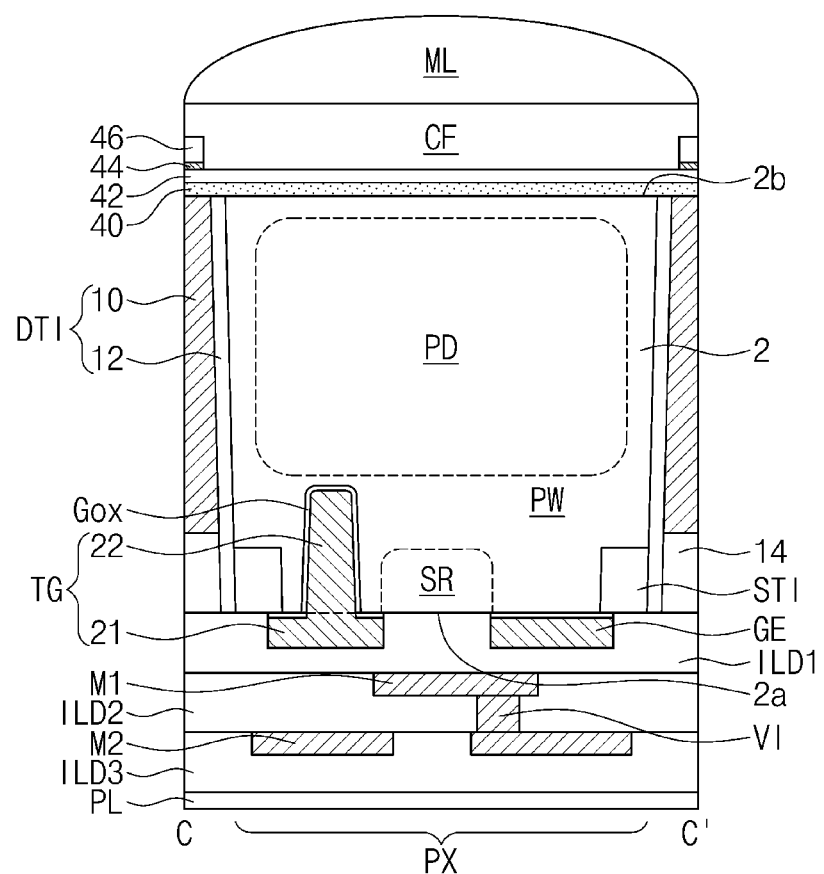

FIGS. 1A and 1B are plan views illustrating a pixel of an image sensor according to an embodiment of the inventive concept. FIGS. 2A to 2C are sectional views taken along lines A-A', B-B', and C-C' of FIG. 1B.

Referring to FIGS. 1A, 1B, and 2A to 2C, the image sensor according to an embodiment of the inventive concept may include a substrate 2. The substrate 2 may include a plurality of pixels PX, which are two-dimensionally arranged in two different directions (e.g., a first direction D1 and a second direction D2). One of the pixels PX is exemplarily illustrated in FIGS. 1A and 1B. The substrate 2 may include a first surface 2a and a second surface 2b, which are opposite to each other. Light may be incident into the substrate 2 through the second surface 2b. The substrate 2 may be a single crystalline wafer, which is formed of or includes silicon and/or germanium, an epitaxial layer, or a silicon-on-insulator (SOI) wafer. The substrate 2 may be doped with impurities of a first conductivity type. The first conductivity type may be, for example, a p-type. The impurity of the first conductivity type may be, for example, boron.

A pixel isolation structure DTI may be disposed in the substrate 2 to separate the pixels PX from each other and to delimit the pixels PX. The pixel isolation structure DTI may have a net-shaped structure, when viewed in a plan view. The pixel isolation structure DTI may include a conductive isolation pattern 10, which is spaced apart from the substrate 2. The conductive isolation pattern 10 may be formed of or include a conductive material which has a refractive index different from the substrate 2. The conductive isolation pattern 10 may be formed of or include at least one of, for example, doped polysilicon or metallic materials. The pixel isolation structure DTI may further include an insulating isolation pattern 12 interposed between the conductive isolation pattern 10 and the substrate 2. The insulating isolation pattern 12 may be formed of or include an insulating material having a refractive index different from the substrate 2. For example, the insulating isolation pattern 12 may be formed of or include silicon oxide. The pixel isolation structure DTI may penetrate the substrate 2. A capping insulating pattern 14 may be disposed below the conductive isolation pattern 10. The capping insulating pattern 14 may be formed of or include at least one of, for example, silicon oxide, silicon oxynitride, or silicon nitride.

A negative bias voltage may be applied to the conductive isolation pattern 10. The conductive isolation pattern 10 may serve as a common bias line. In this case, the dark current property of the image sensor may be improved because the negative bias voltage immobilizes holes, which may exist on the surface of the substrate 2 in contact with the pixel isolation structure DTI.

In each pixel PX, the substrate 2 may have three active regions ACT1 to ACT3, which are provided near the first surface 2a. The active regions ACT1 to ACT3 may be delimited by a shallow trench isolation layer STI and/or a device isolation region SR, which are formed in the substrate 2 and near the first surface 2a. The shallow trench isolation layer STI may be formed by a shallow trench isolation (STI) method. The shallow trench isolation layer STI may be formed of or include at least one of silicon oxide, silicon nitride, or silicon oxynitride and may have a single- or multi-layered structure. The device isolation region SR may be formed to have the same conductivity type (i.e., the first conductivity type) as the substrate 2, and in this case, a doping concentration of the device isolation region SR may be equal to or higher than that of the substrate 2.

The first active region ACT1 may be an active region for a transfer transistor. A transfer gate TG may be disposed on the first active region ACT1. The transfer gate TG may be of a vertical type, as shown in FIG. 2A. For example, the transfer gate TG may include a first transfer gate portion 21, which is disposed on the first surface 2a of the substrate 2, and a second transfer gate portion 22, which is inserted into the substrate 2. In an embodiment, the transfer gate TG may include the first transfer gate portion 21, without the second transfer gate portion 22, and may be of a planar type. A gate insulating layer Gox may be interposed between the transfer gate TG and the substrate 2. The gate insulating layer Gox may be formed of or include at least one of silicon oxide, metal oxide, silicon nitride, or silicon oxynitride and may have a single- or multi-layered structure.

A floating diffusion region FD may be disposed in a portion of the first active region ACT1 located beside the transfer gate TG. The floating diffusion region FD may be doped to have a second conductivity type different from the first conductivity type of the substrate 2. For example, the floating diffusion region FD may be doped with n-type impurities (e.g., phosphorus or arsenic). The transfer gate TG and the floating diffusion region FD may constitute one of transfer transistors T1 to T9 described with reference to FIGS. 4 to 20. For example, the floating diffusion region FD may serve as a common drain of the transfer transistors TX. The floating diffusion region FD may serve as a source of a dual conversion transistor DCX. The floating diffusion region FD may be electrically connected to a source follower gate SF of a source follower transistor SX.

A photoelectric conversion part PD may be disposed in the pixel PX of the substrate 2. A well region PW may be disposed between the photoelectric conversion part PD and the first surface 2a. Impurities of the first conductivity type may be doped in the well region PW (e.g., a portion of the substrate 2). A concentration of the first conductivity type impurity doped in the well region PW may be equal to or higher than a concentration of the impurities doped in the substrate 2. The photoelectric conversion part PD may be doped to have a second conductivity type different from the first conductivity type. For example, the photoelectric conversion part PD may be doped with n-type impurities (e.g., phosphorus or arsenic). In this case, the photoelectric conversion part PD, which is the n-type impurity region, in conjunction with the substrate 2 adjacent thereto and/or the p-type well region PW, may form a pn junction that generates electron-hole pairs when light is incident thereto.

When viewed in a plan view, the second active region ACT2 may have a bar shape elongated in the second direction D2. A gate electrode GE may be disposed on the second active region ACT2. The gate electrode GE may correspond to one of source follower gates SF1 to SF5, selection gates SEL, SEL1, and SEL2, a reset gate RG, a dual conversion gate DCG, and dummy gates DM, DM1, DM2, and DM3, which will be described with reference to FIGS. 4 to 20. The gate insulating layer Gox may be interposed between the gate electrode GE and the substrate 2. A first source/drain region SD1 may be disposed at a side of the gate electrode GE (e.g., near a left side surface of the gate electrode GE in FIG. 1A or 1B), and a second source/drain region SD2 may be disposed at an opposite side of the gate electrode GE (e.g., near a right side surface of the gate electrode GE in FIG. 1A or 1B). The first and second source/drain regions SD1 and SD2 may be doped to have a second conductivity type different from the first conductivity type. The gate electrode GE and the first and second source/drain regions SD1 and SD2 may correspond to one of source follower transistors S1 to S5, selection transistors SE, SE1, and SE2, a reset transistor RX, a dual conversion transistor DCX, and a dummy transistor DMX, which will be described with reference to FIGS. 4 to 20.

A ground region GR may be formed in the third active region ACT3 of the substrate 2 and near the first surface 2a. The ground region GR may be doped to have an impurity concentration that is higher than that of the substrate 2.

The shallow trench isolation layer STI may be disposed between the first and second active regions ACT1 and ACT2, as shown in FIG. 1A, or the device isolation region SR may be formed between the first and second active regions ACT1 and ACT2, as shown in FIG. 1B. In the case where, as shown in FIG. 1B, an occupying area of the shallow trench isolation layer STI on the first surface 2a is reduced, it may be possible to reduce the dark current issue, which may be caused by dangling bonds formed on the surface of the substrate 2 during a process of forming the shallow trench isolation layer STI, compared the case of FIG. 1A. Furthermore, in the case where, as shown in FIG. 1B, the device isolation region SR is provided in a region near the floating diffusion region FD in the first active region ACT1, it may be possible to reduce the junction capacitance or the parasitic capacitance, compared with the case in which the shallow trench isolation layer STI is disposed as shown in FIG. 1A. The shallow trench isolation layer STI may be interposed between the ground region GR, to which a ground voltage is applied, and the first active region ACT1, in which the transfer transistor are disposed, and may prevent a short circuit issue from occurring therebetween.

First to third interlayer insulating layers ILD1, ILD2, and ILD3 and a passivation layer PL may be sequentially stacked on the first surface 2a. Each of the first to third interlayer insulating layers ILD1, ILD2, and ILD3 may be formed of or include at least one of, for example, silicon oxide, silicon nitride, silicon oxynitride, or porous insulating materials and may have a single- or multi-layered structure. The passivation layer PL may be formed of or include, for example, silicon nitride.

First interconnection lines M1 and an FD connection line FDC may be disposed between the first interlayer insulating layer ILD1 and the second interlayer insulating layer ILD2. The FD connection line FDC may be connected to the floating diffusion region FD through an FD contact CT_FD penetrating the first interlayer insulating layer ILD1. One of the first interconnection lines M1 may be connected to the ground region GR through a GND contact CT_GND penetrating the first interlayer insulating layer ILD1. The GND contact CT_GND may be used to apply a ground voltage or a negative bias voltage to the ground region GR.

Another of the first interconnection lines M1 may be connected to the first source/drain region SD1 through a SD1 contact CT_SD1 penetrating the first interlayer insulating layer ILD1. Other of the first interconnection lines M1 may be connected to the second source/drain region SD2 through a SD2 contact CT_SD2 penetrating the first interlayer insulating layer ILD1.

Herein, the FD connection line FDC may be referred to as a floating diffusion region connection line. The FD contact CT_FD may be referred to as a floating diffusion region connection contact. The GND contact CT_GND may be referred to as a ground contact. The SD1 contact CT_SD1 may be referred to as a first source/drain connection contact. The SD2 contact CT_SD2 may be referred to as a second source/drain connection contact.

Although not shown in the sectional views of FIGS. 2A to 2C, referring to FIGS. 1A and 1B, a TG contact CT_TG may be disposed on the transfer gate TG, and in an embodiment, the TG contact CT_TG may be provided to penetrate the first interlayer insulating layer ILD1 and may be connected to still other one of the first interconnection lines M1. A GE contact CT_GE may be disposed on the gate electrode GE, and in an embodiment, the GE contact CT_GE may be provided to penetrate the first interlayer insulating layer ILD1 and may be connected to yet other one of the first interconnection lines M1. Herein, the TG contact CT_TG may be referred to as a transfer gate contact. The GE contact CT_GE may be referred to as a gate contact.

Second interconnection lines M2 may be disposed between the second interlayer insulating layer ILD2 and the third interlayer insulating layer ILD3. Some of the first interconnection lines M1 may be connected to some of the second interconnection lines M2 through vias VI penetrating the second interlayer insulating layer ILD2.

A fixed charge layer 40 may be disposed on the second surface 2b and may be in contact with the second surface 2b. The fixed charge layer 40 may be formed of a metal oxide layer, whose oxygen content is lower than its stoichiometric ratio, or a metal fluoride layer, whose fluorine content ratio is lower than its stoichiometric ratio. In this case, the fixed charge layer 40 may have negative fixed charges. The fixed charge layer 40 may be formed of metal oxide or metal fluoride containing at least one metallic element that is selected from the group consisting of hafnium (Hf), zirconium (Zr), aluminum (Al), tantalum (Ta), titanium (Ti), yttrium (Y), and lanthanoid. A hole accumulation phenomenon may occur near the fixed charge layer 40. In this case, it may be possible to effectively suppress the dark current issue and the white spot issue. In an embodiment, the fixed charge layer 40 may be at least one of an aluminum oxide layer and a hafnium oxide layer.

An anti-reflection layer 42 may be disposed on the fixed charge layer 40. The anti-reflection layer 42 may be formed of or include, for example, silicon nitride. A light-blocking pattern 44 and a low-refractive pattern 46 may be sequentially stacked on the anti-reflection layer 42. When viewed in a plan view, the light-blocking pattern 44 and the low-refractive pattern 46 may have a net-shaped structure and may be overlapped with the pixel isolation structure DTI. The light-blocking pattern 44 and the low-refractive pattern 46 may be provided to expose the anti-reflection layer 42 on the photoelectric conversion part PD. A color filter CF may be disposed on the anti-reflection layer 42. A micro lens ML may be disposed on the color filter CF.

The light-blocking pattern 44 may be formed of or include an optically opaque material (e.g., titanium). A side surface of the low-refractive pattern 46 may be aligned to a side surface of the light-blocking pattern 44. The light-blocking pattern 44 and the low-refractive pattern 46 may prevent a cross-talk issue from occurring between adjacent ones of the pixels. The low-refractive pattern 46 may be formed of or include an organic material. The low-refractive pattern 46 may have a refractive index that is lower than a refractive index of the color filter CF. For example, the low-refractive pattern 46 may have a refractive index of about 1.3 or lower.

The color of the color filter CF may vary depending on the pixel PX. The color filter CF may be formed of or include a photoresist material containing dye or pigment. The color filter CF may have one of blue, red, and green colors. Alternatively, the color filter CF may have one of cyan, yellow, and magenta colors. In an embodiment, a plurality of the color filters CF may be two-dimensionally arranged in the first and second directions D1 and D2. The color filters CF may be arranged in the form of a Bayer pattern, a 2×2 Tetra pattern, or a 3×3 Nona pattern.

FIG. 3 is a plan view illustrating an image sensor 1000 according to an embodiment of the inventive concept.

Referring to FIG. 3, an image sensor 1000 according to the present embodiment may include first to third pixel groups GRP1, GRP2, and GRP3, which are two-dimensionally arranged in the first and second directions D1 and D2. A first color filter of FIG. 6A may be disposed on the first pixel group GRP1. A second color filter may be disposed on the second pixel group GRP2. A third color filter may be disposed on the third pixel group GRP3. The first to third color filters may have different colors from each other. For example, the second color filter may be green. One of the first and third color filters may be red, and the other may be blue. Thus, a different color filter may be disposed on each of the first to third pixel groups GRP1, GRP2, and GRP3. The first to third pixel groups GRP1, GRP2, and GRP3 may be two-dimensionally arranged in the first and second directions D1 and D2 to form a plurality of group units, each of which includes the first to third pixel groups GRP1, GRP2, and GRP3 of FIG. 3.

Each of the first to third pixel groups GRP1, GRP2, and GRP3 may include first to ninth pixels PX1 to PX9, which are arranged to form three rows in the first direction D1 and three columns in the second direction D2 (i.e., to form a 3×3 array structure or a Nona structure). In each of the first to third pixel groups GRP1, GRP2, and GRP3, the first to third pixels PX1 to PX3 may be sequentially arranged in the first direction D1 to constitute a first column. The fourth to sixth pixels PX4 to PX6 may be sequentially arranged in the first direction D1 to constitute a second column. The seventh to ninth pixels PX7 to PX9 may be sequentially arranged in the first direction D1 to constitute a third column. The first, fourth, and seventh pixels PX1, PX4, and PX7 may be sequentially arranged in the second direction D2 to constitute a first row. The second, fifth, and eighth pixels PX2, PX5, and PX8 may be sequentially arranged in the second direction D2 to constitute a second row. The third, sixth, and ninth pixels PX3, PX6, and PX9 may be sequentially arranged in the second direction D2 to constitute a third row. The photoelectric conversion parts PD may be disposed in the first to ninth pixels PX1 to PX9, respectively. The photoelectric conversion parts PD of the first to ninth pixels PX1 to PX9 may correspond to first to ninth photoelectric conversion parts PD1 to PD9, respectively, of FIG. 8A.

The micro lenses ML may be disposed on the first to ninth pixels PX1 to PX9, respectively. The pixel isolation structure DTI described with reference to FIGS. 1A to 2C may be provided in the substrate 2 to be interposed between the first to ninth pixels PX1 to PX9 and between the first to third pixel groups GRP1, GRP2, and GRP3.

In an embodiment, at least three source follower transistors (e.g., S1 to S3 of FIG. 8A) may be disposed in each of the first to third pixel groups GRP1, GRP2, and GRP3. The at least three source follower transistors may be connected in parallel to each other to form a fingered-type source follower transistor, and in this case, it may be possible to reduce signal noise.

In an embodiment, at least one selection transistor (e.g., SE of FIG. 8A) may be disposed in each of the first to third pixel groups GRP1, GRP2, and GRP3. The at least one selection transistor may be disposed in at least one of the fourth to sixth pixels PX4 to PX6, which constitute the second column in each of the first to third pixel groups GRP1, GRP2, and GRP3. Accordingly, the at least one selection transistor may be located at a far distant from the FD connection line FDC and an output line Vout for adjacent ones of the pixel groups GRP1, GRP2, and GRP3, and thus, it may be possible to reduce an interference issue therebetween.

Figure 4:
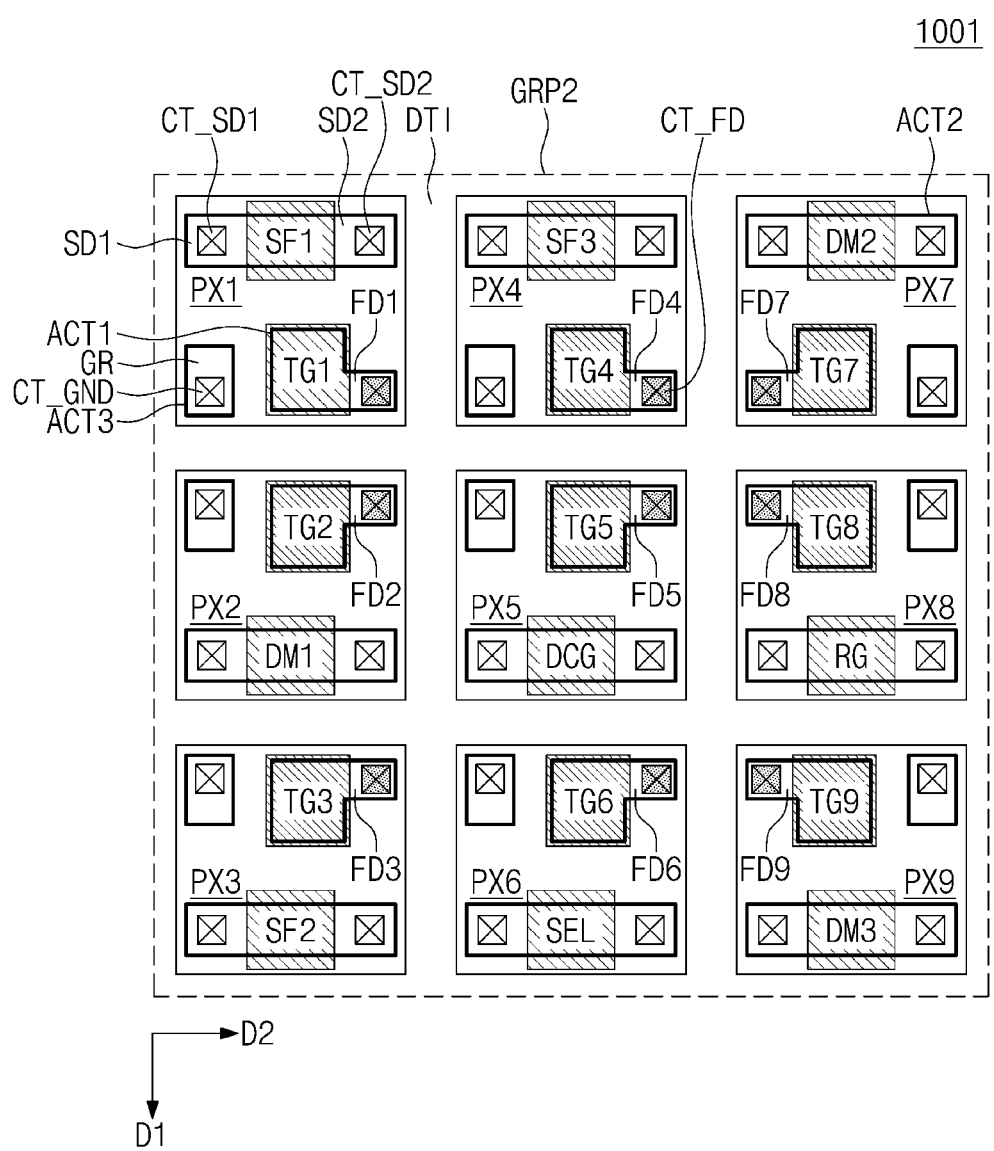
FIG. 4 is a plan view illustrating an image sensor according to an embodiment of the inventive concept.

FIG. 4 is a plan view illustrating an image sensor 1001 according to an embodiment of the inventive concept.

Referring to FIG. 4, the second pixel group GRP2 in the image sensor 1001 according to the present embodiment may include the first to ninth pixels PX1 to PX9, which are arranged to form three rows in the first direction D1 and three columns in the second direction D2 (i.e., to form a 3×3 array structure or a Nona structure). The first to third active regions ACT1, ACT2, and ACT3 described with reference to FIGS. 1A and 1B may be disposed in each of the pixels PX1 to PX9. First to ninth transfer gates TG1 to TG9 and first to ninth floating diffusion regions FD1 to FD9 may be disposed in the first active regions ACT1 of the first to ninth pixels PX1 to PX9, respectively. The first to ninth transfer gates TG1 to TG9 and the first to ninth floating diffusion regions FD1 to FD9 may constitute the first to ninth transfer transistors T1 to T9 of FIG. 8A.

Some of the first active regions ACT1 of the first to ninth pixels PX1 to PX9 may have shapes that are symmetric to each other. For example, the first active regions ACT1 of the first, fourth, and seventh pixels PX1, PX4, and PX7 may be mirror symmetric to and directly adjacent to the first active regions ACT1 of the second, fifth, and eighth pixels PX2, PX5, and PX8, respectively, about a line/axis extending in the second direction D2. The first active regions ACT1 of the fourth, fifth, and sixth pixels PX4, PX5, and PX6 may be mirror symmetric to and directly adjacent to the first active regions ACT1 of the seventh, eighth, and ninth pixels PX7, PX8, and PX9, respectively, about a line/axis extending in the first direction D1. It will be understood that when a first element is referred to as being "adjacent" to a second element, an intervening element may be present between the first element and the second element. In contrast, when a first element is referred to as being "directly adjacent" to a second element, there are no intervening elements present between the first element and the second element.

Some of the first to ninth floating diffusion regions FD1 to FD9 may be disposed to be aligned to each other in a specific direction. For example, the first to third floating diffusion regions FD1 to FD3 may be aligned to form a line parallel to the first direction D1 or to be overlapped with a straight line parallel to the first direction D1. Similarly, the fourth to sixth floating diffusion regions FD4 to FD6 may be aligned to form a line parallel to the first direction D1 or to be overlapped with a straight line parallel to the first direction D1. The seventh to ninth floating diffusion regions FD7 to FD9 may be aligned to form a line parallel to the first direction D1 or to be overlapped with a straight line parallel to the first direction D1. The fourth, fifth, seventh, and eighth floating diffusion regions FD4, FD5, FD7, and FD8 may be disposed to be directly adjacent to each other. Due to the afore-described arrangements of the first active regions ACT1 and the first to ninth floating diffusion regions FD1 to FD9 in the first to ninth pixels PX1 to PX9, it may be possible to relatively reduce a length of the FD connection line FDC of FIG. 5 connecting the first to ninth floating diffusion regions FD1 to FD9 and thereby to reduce a signal noise issue in the image sensor 1001.

A first source follower gate SF1 may be disposed on the second active region ACT2 of the first pixel PX1. A second source follower gate SF2 may be disposed on the second active region ACT2 of the third pixel PX3. A third source follower gate SF3 may be disposed on the second active region ACT2 of the fourth pixel PX4. The dual conversion gate DCG may be disposed on the second active region ACT2 of the fifth pixel PX5. A selection gate SEL may be disposed on the second active region ACT2 of the sixth pixel PX6. In the present embodiment, the selection gate SEL may be provided in the center column (i.e., the second column) of the second pixel group GRP2, and thus, it may be possible to suppress a signal coupling issue between the output lines Vout of adjacent ones of the pixel groups and thereby to reduce a signal noise issue in the image sensor 1001.

The reset gate RG may be disposed on the second active region ACT2 of the eighth pixel PX8. A first dummy gate DM1 may be disposed on the second active region ACT2 of the second pixel PX2. A second dummy gate DM2 may be disposed on the second active region ACT2 of the seventh pixel PX7. A third dummy gate DM3 may be disposed on the second active region ACT2 of the ninth pixel PX9. The dummy gates DM1 to DM3 may be formed to prevent a failure which is caused by a loading effect in a process of forming the gate electrodes.

Although not shown in FIG. 4, the TG contact CT_TG may be disposed on the transfer gates TG1 to TG9, as shown in FIGS. 1A and 1B. The GE contact CT_GE may be disposed on the gates SF1-SF3, DCG, SEL, RG, and DM1-DM3, respectively, which are disposed on the second active regions ACT2, as shown in FIGS. 1A and 1B. Except for the above features, the image sensor according to the present embodiment may be substantially the same as or similar to those in the previous embodiments described with reference to FIGS. 1 to 3.

The gates SF1-SF3, DCG, SEL, RG, and DM1-DM3, which are disposed on the second active regions ACT2 of FIG. 4, and the source/drain regions SD1 and SD2, which are disposed at both sides thereof, may constitute transistors. For example, the first to third source follower gates SF1, SF2, and SF3 and the source/drain regions SD1 and SD2 disposed at both sides thereof may constitute the first to third source follower transistors S1, S2, and S3, respectively, of FIG. 8A. The dual conversion gate DCG and the source/drain regions SD1 and SD2 disposed at both sides thereof may constitute the dual conversion transistor DCX of FIG. 8A. The selection gate SEL and the source/drain regions SD1 and SD2 disposed at both sides thereof may constitute the selection transistor SE of FIG. 8A. The reset gate RG and the source/drain regions SD1 and SD2 disposed at both sides thereof may constitute the reset transistor RX of FIG. 8A. The first to third dummy gates DM1 to DM3 and the source/drain regions SD1 and SD2 disposed at both sides thereof may constitute the dummy transistors DMX, respectively, of FIG. 8B.

Figure 5:
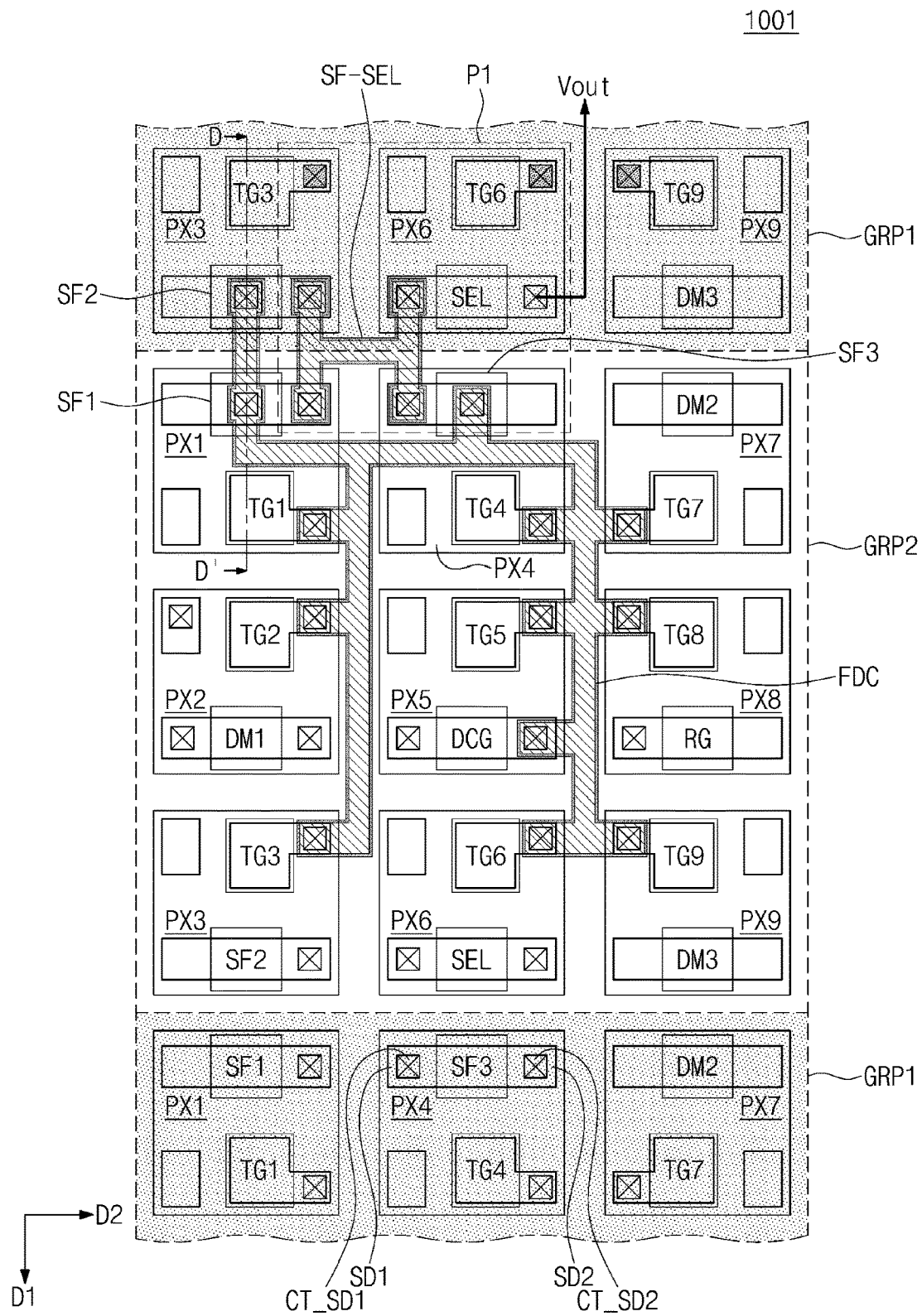
FIG. 5 is a plan view illustrating an interconnection structure of the image sensor of FIG. 4.
Figure 6A:
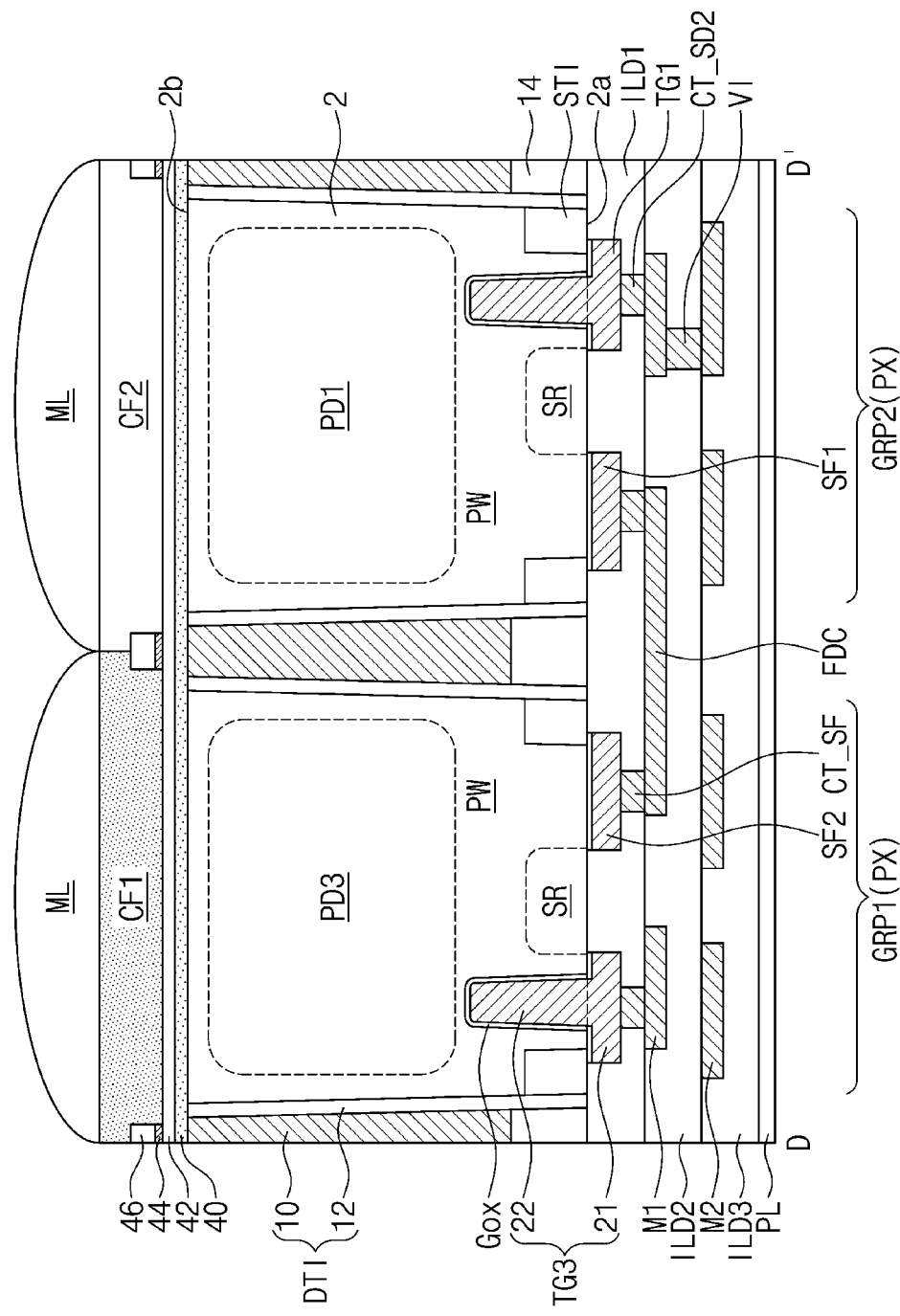
FIGS. 6A and 6B are sectional views taken along a line D-D' of FIG. 5.
Figure 6B:
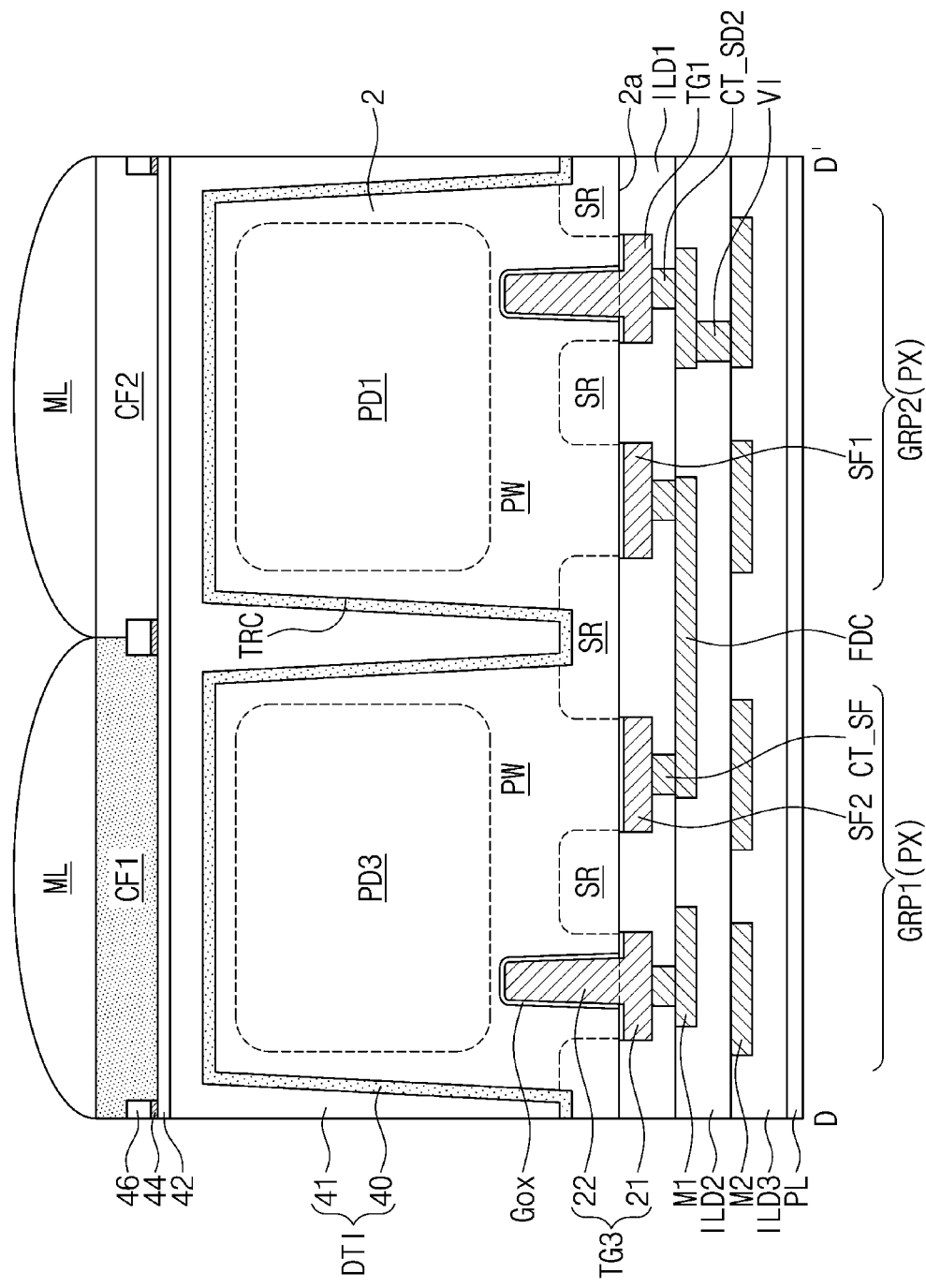
Figure 7:
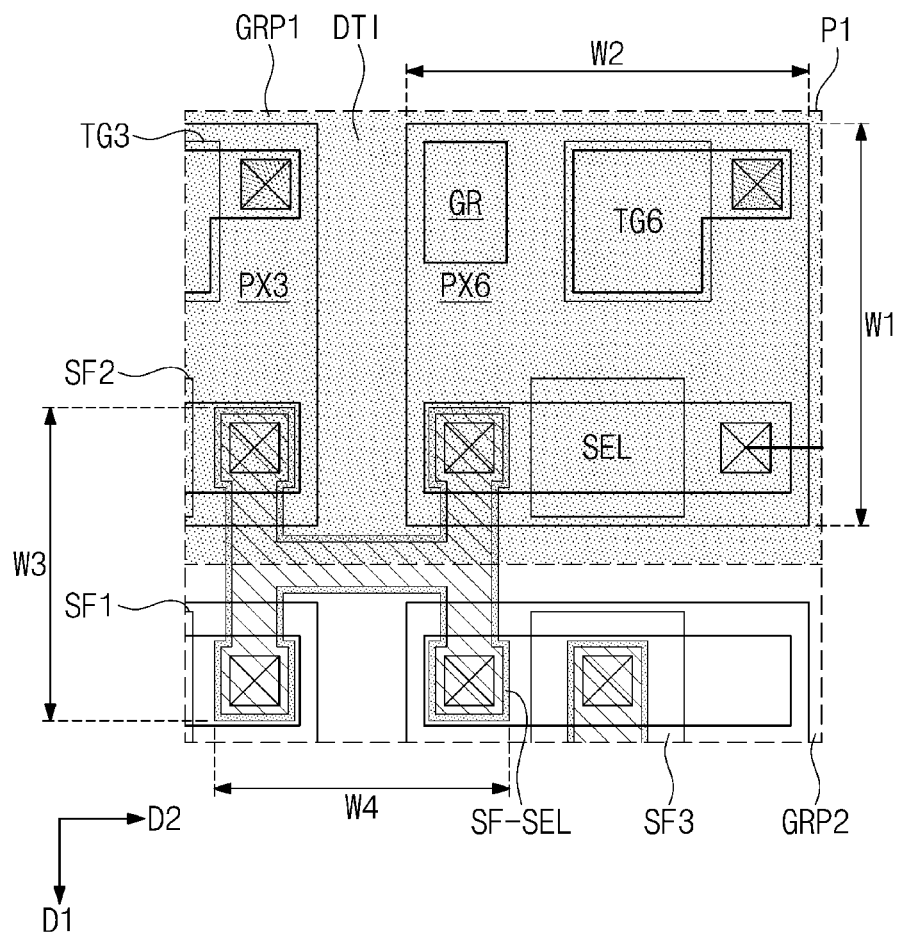
FIG. 7 is an enlarged plan view of a portion 'P1' of FIG. 5.

FIG. 5 is a plan view illustrating an interconnection structure of the image sensor 1001 of FIG. 4. In order to reduce complexity in the drawings and to provide better understanding of the inventive concept, some of the contacts may be omitted from FIG. 5. FIGS. 6A and 6B are sectional views taken along a line D-D' of FIG. 5. FIG. 7 is an enlarged plan view of a portion 'P1' of FIG. 5.

Referring to FIGS. 2A, 5, and 6A, the first pixel groups GRP1 may be disposed at both sides (i.e., a first side and a second side) of the second pixel group GRP2 in the first direction D1. The first to ninth pixels PX and the transistors may be disposed in the first pixel group GRP1 in the same manner as the second pixel group GRP2 of FIG. 4. At the first side of the second pixel group GRP2, the third, sixth, and ninth pixels PX3, PX6, and PX9 of the first pixel group GRP1 may be placed directly adjacent to the first, fourth, and seventh pixels PX1, PX4, and PX7 of the second pixel group GRP2, respectively. The second source follower gate SF2 disposed in the third pixel PX3 of the first pixel group GRP1 may be placed directly adjacent to the first source follower gate SF1 disposed in the first pixel PX1 of the second pixel group GRP2. The selection gate SEL disposed in the sixth pixel PX6 of the first pixel group GRP1 may be placed directly adjacent to the third source follower gate SF3 disposed in the fourth pixel PX4 of the second pixel group GRP2. The third dummy gate DM3 disposed in the ninth pixel PX9 of the first pixel group GRP1 may be placed directly adjacent to the second dummy gate DM2 disposed in the seventh pixel PX7 of the second pixel group GRP2. At the second side of the second pixel group GRP2, the first, fourth, and seventh pixels PX1, PX4, and PX7 of the first pixel group GRP1 may be directly adjacent to the third, sixth, and ninth pixels PX3, PX6, and PX9 of the second pixel group GRP2, respectively.

The first to ninth floating diffusion regions FD1 to FD9 of the second pixel group GRP2 may be connected to the first and third source follower gates SF1 and SF3 of the second pixel group GRP2 and the second source follower gate SF2 of the first pixel group GRP1 through the FD contacts CT_FD, the FD connection line FDC, and an SF contact CT_SF. Herein, the SF contact CT_SF may be referred to as a source follower gate contact. The FD contacts CT_FD may be provided to penetrate the first interlayer insulating layer ILD1 and may be in contact with the first to ninth floating diffusion regions FD1 to FD9 of the second pixel group GRP2. The SF contact CT_SF may be provided to penetrate the first interlayer insulating layer ILD1 and may be in contact with the first to third source follower gates SF1 to SF3.

The FD connection line FDC may be disposed on the first interlayer insulating layer ILD1. A portion of the FD connection line FDC may be overlapped with a boundary between the first pixel group GRP1 and the second pixel group GRP2. A larger portion of the FD connection line FDC connecting the floating diffusion regions FD1 to FD9 of the second pixel group GRP2 may be placed on the second pixel group GRP2, but a smaller portion of the FD connection line FDC may be extended to a region on the first pixel group GRP1.

The FD connection line FDC may be connected to the second source/drain region SD2 on the right of the dual conversion gate DCG, which is disposed in the fifth pixel PX5 of the second pixel group GRP2. A portion of the FD connection line FDC connecting the first to ninth floating diffusion regions FD1 to FD9 may have a shape of letter 'U' or 'C'. The FD connection line FDC and the FD contacts CT_FD may constitute an FD connection structure. The FD connection line FDC may be located at the same height as the first interconnection lines M1, and thus, connection lengths between the first to ninth floating diffusion regions FD1 to FD9 and the first to third source follower gates SF1 to SF3 may be relatively reduced. Accordingly, it may be possible to suppress an interference phenomenon (e.g., parasitic capacitance), which may occur between neighboring interconnection lines, and thereby to reduce a signal noise issue in the image sensor 1001. In addition, it may be possible to prevent the capacitance of the FD connection structure, which connects the first to ninth floating diffusion regions FD1 to FD9, from being excessively increased.

The second source/drain region SD2 on the right of the first source follower gate SF1 of the second pixel group GRP2, the first source/drain region SD1 on the left of the third source follower gate SF3 of the second pixel group GRP2, the second source/drain region SD2 on the right of the second source follower gate SF2 of the first pixel group GRP1, and the first source/drain region SD1 on the left of the selection gate SEL of the first pixel group GRP1 may be electrically connected to each other by an SF-SEL line SF-SEL. Herein, the SF-SEL line SF-SEL may be referred to as a source follower gate-selection gate connecting line. The SF-SEL line SF-SEL may be located at the same height as the FD connection line FDC. The SF-SEL line SF-SEL may be located on the first interlayer insulating layer ILD1. The SF-SEL line SF-SEL may have a shape of letter 'H', when viewed in a plan view. The SF-SEL line SF-SEL may have a mirror symmetric shape about a boundary between the first and second pixel groups GRP1 and GRP2. For example, a line/axis of symmetry may extend in the second direction D2 along the boundary between the first pixel group GRP1 and the second pixel group GRP2. The second source/drain region SD2 on the right of the selection gate SEL may be connected to the output line Vout.

Since the first to third source follower gates SF1 to SF3 and the selection gate SEL are disposed to be directly adjacent to each other in the image sensor 1001, the SF-SEL line SF-SEL may have a relatively very short length. For example, referring to FIG. 7, each of the pixels PX, which are delimited by the pixel isolation structure DTI, may have a first width W1 in the first direction D1 and a second width W2 in the second direction D2. The SF-SEL line SF-SEL may have a third width W3 in the first direction D1 and may have a fourth width W4 in the second direction D2. The third width W3 may be smaller than the first width W1. The fourth width W4 may be smaller than the second width W2. Accordingly, the SF-SEL line SF-SEL may have a relatively very short length, and this may make it possible to reduce a signal noise issue in the image sensor 1001.

Referring to FIG. 6B, in the present embodiment, the active regions ACT1 to ACT2 may be defined in the first surface 2a by only the device isolation regions SR, without the shallow trench isolation layer STI. The pixel isolation structure DTI may have a structure different from FIG. 6A. For example, a deep trench TRC may be formed from the second surface 2b toward the first surface 2a in the substrate 2. The deep trench TRC may be spaced apart from the first surface 2a. A bottom surface of the deep trench TRC may be in contact with the device isolation regions SR. An inner surface and a bottom surface of the deep trench TRC and the second surface 2b may be covered with the fixed charge layer 40. The deep trench TRC may be filled with an insulating gapfill layer 41. The insulating gapfill layer 41 may be extended to cover the fixed charge layer 40 on the second surface 2b. The insulating gapfill layer 41 may be formed of or include, for example, silicon oxide. The fixed charge layer 40 and the insulating gapfill layer 41 in the deep trench TRC may constitute the pixel isolation structure DTI. The anti-reflection layer 42 may be located on the insulating gapfill layer 41. Except for the afore-described features, the image sensor according to the present embodiment may be configured to have the same or similar features as the previous embodiments.

Figure 8A:
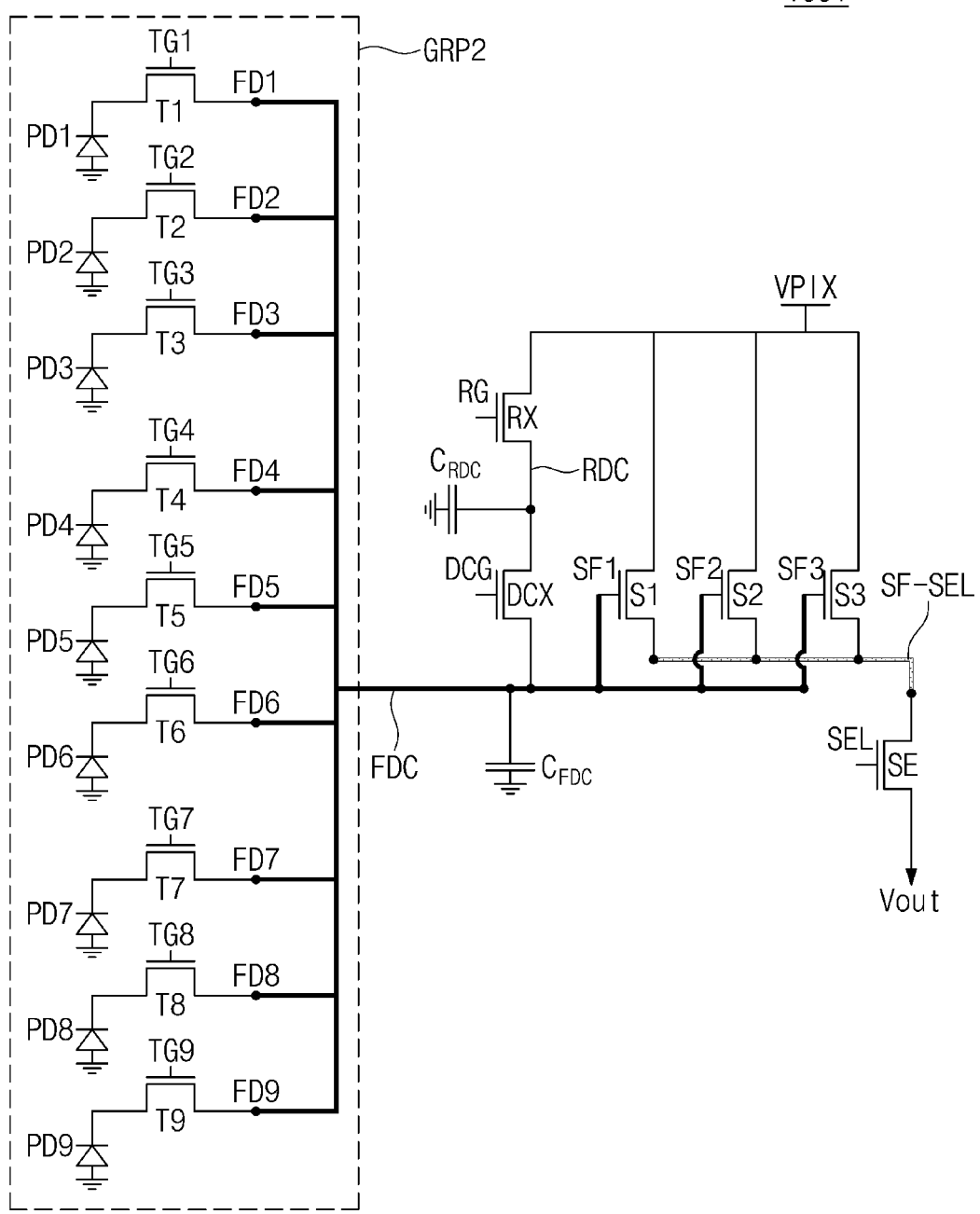
FIG. 8A is a circuit diagram of the image sensor of FIG. 5.

FIG. 8A is a circuit diagram of the image sensor of FIG. 5.

Referring to FIGS. 5 and 8A, the image sensor 1001 according to the present embodiment may include the transfer transistors T1 to T9, the dual conversion transistor DCX, the reset transistor RX, and the first and third source follower transistors S1 and S3, which are disposed in the second pixel group GRP2, and the second source follower transistor S2 and a selection transistor SE, which are disposed in the first pixel group GRP1 and are electrically connected to the first and third source follower transistors S1 and S3. The first to ninth photoelectric conversion parts PD1 to PD9 of the second pixel group GRP2 may be provided to produce electrons or electric charges from light incident into the image sensor 1001 and to accumulate the electrons or electric charges. End portions of the transfer transistors T1 to T9 may be connected to the photoelectric conversion parts PD1 to PD9, respectively, and the floating diffusion regions FD1 to FD9, which are opposite end portions of the transfer transistors T1 to T9, may be connected in common to the FD connection line FDC.

The transfer transistors T1 to T9 may transmit electrons, which are accumulated in the photoelectric conversion parts PD1 to PD9, to the FD connection line FDC, in response to electrical signals or voltages applied to the transfer gates TG1 to TG9. The FD connection line FDC may be used to accumulate and store electrons that are provided from the transfer transistors T1 to T9. The FD connection line FDC (or the floating diffusion regions FD1 to FD9) may have a capacitance of $C_{FDC}$. In an embodiment, the capacitance $C_{FDC}$ may be a sum of capacitances of the FD connection line FDC, at least one of the floating diffusion regions FD1 to FD9, and the FD contacts CT_FD.

Although not shown in FIG. 5, the first source/drain region SD1 (e.g., one terminal of the dual conversion transistor DCX in FIG. 8A) on the left of the dual conversion gate DCG in FIG. 5 may be connected to the first source/drain region SD1 (e.g., one terminal of the reset transistor RX in FIG. 8A) on the left of the reset gate RG by one of the first interconnection lines M1 and one of the second interconnection lines M2. An RD connection line RDC connecting a terminal of the dual conversion transistor DCX to a terminal of the reset transistor RX may have capacitance of $C_{RDC}$. In an embodiment, the capacitance $C_{RDC}$ may correspond to a sum of capacitances of the first source/drain region SD1 on the left of the dual conversion gate DCG, the first source/drain region SD1 on the left of the reset gate RG, and the contacts and the interconnection lines connecting them.

A voltage level of the FD connection line FDC may depend on the capacitance $C_{FDC}$ and an amount of electrons or electric charges provided from the transfer transistors T1 to T9. The reset transistor RX may be used to reset the FD connection line FDC or the floating diffusion regions FD1 to FD9. For example, in the case where the dual conversion transistor DCX is turned on, the reset transistor RX may connect or disconnect the FD connection line FDC to or from a power voltage VPIX in response to an electrical signal or a reset signal applied to the reset gate RG. In the case where the reset signal is applied to the reset transistor RX, the FD connection line FDC or the floating diffusion regions FD1 to FD9 may have the same voltage level as the power voltage VPIX, and in this case, electric charges, which are stored in the FD connection line FDC or the floating diffusion regions FD1 to FD9, may be removed or discharged to the outside.

The first to third source follower transistors S1 to S3 may be provided between and connected in parallel to the power voltage VPIX and the selection transistor SE. To facilitate the parallel connection of the first to third source follower transistors S1 to S3, the first to third source follower gates SF1 to SF3 may be disposed to be directly adjacent to each other in the image sensor 1001, as shown in FIG. 5.

The gates SF1 to SF3 of the first to third source follower transistors S1 to S3 may be connected to the FD connection line FDC. The first to third source follower transistors S1 to S3 may output an output signal to the selection transistor SE, based on a voltage level of the FD connection line FDC. The first to third source follower transistors S1 to S3 may be a source follower buffer amplifier. The selection transistor SE may be disposed between and connected to the first to third source follower transistors S1 to S3 and the output line Vout. The selection transistor SE may be used to transmit an output signal through the output line Vout, based on an electrical signal applied to the selection gate SEL.

The transfer transistors T1 to T9 in each pixel group may be turned on at substantially the same time, and thus, electrical signals from the pixels PX1 to PX9 in each pixel group may be merged and read as an output value of one unit pixel. Alternatively, the transfer transistors T1 to T9 in each pixel group may be sequentially turned on, and in this case, the electrical signals from the pixels PX1 to PX9 may be read as separate output values.

The dual conversion transistor DCX may be disposed between and connected to the floating diffusion region FD1 and the reset transistor RX. If the dual conversion transistor DCX is turned off, a Full Well Capacity (FWC) of the second pixel group GRP2 may be substantially equal to the capacitance $C_{FDC}$ of the FD connection line FDC (or the floating diffusion regions FD1 to FD9). If the dual conversion transistor DCX is turned on, the FWC of the second pixel group GRP2 may be a sum of capacitances $C_{FDC}$ and $C_{RDC}$ of the FD and RD connection lines.

For example, if the image sensor 1001 is operated under a low brightness condition, the dual conversion transistor DCX may be turned off such that the second pixel group GRP2 has a relatively low FWC, and in this case, the conversion gain of the second pixel group GRP2 may be relatively increased, where the unit of the conversion gain is $\mu V/e^-$. If the image sensor 1001 is operated under a high brightness condition, the dual conversion transistor DCX may be turned on such that the second pixel group GRP2 has a relatively high FWC, and in this case, the conversion gain of the second pixel group GRP2 may be relatively lowered. The dual conversion transistor DCX may change the conversion gain of the second pixel group GRP2 in response to an electrical signal applied to the dual conversion gate DCG.

The first to third source follower gates SF1 to SF3 may be connected in parallel to each other to form a fingered-type source follower transistor. The source follower transistor may be most sensitive to an inherent noise (e.g., a thermal noise and a flicker noise) of a transistor, compared with other transistors, such as the transfer, reset, and selection transistors. A noise, which is produced in the source follower transistor device, may be transmitted to an internal circuit as it is, and this may lead to deterioration in image quality of the image sensor. In the case where the source follower transistor is formed in the fingered type, it may be possible to reduce the inherent noise (e.g., the thermal and flicker noises) of the transistor and thereby to more accurately read an electric potential of the FD connection line FDC.

Figure 8B:
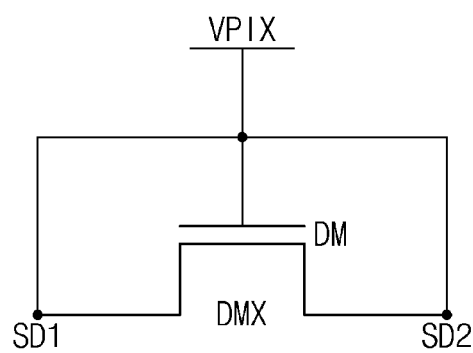
FIG. 8B is a circuit diagram of dummy transistors illustrated in FIG. 5.

FIG. 8B is a circuit diagram of dummy transistors illustrated in FIG. 5.

Referring to FIGS. 5 and 8B, the power voltage VPIX may be applied to both of the gate and source/drain terminals of the dummy transistor DMX. That is, the power voltage VPIX may be applied to all of the first to third dummy gates DM1 to DM3 and the first and second source/drain regions SD1 and SD2 at both sides thereof. If the first to third dummy gates DM1 to DM3 are in an electrical floating state, the first to third dummy gates DM1 to DM3 may lead to a noise issue in electrical signals which are applied to interconnection lines adjacent to the first to third dummy gates DM1 to DM3. However, according to an embodiment of the inventive concept, since the power voltage VPIX is applied to all of the gate and source/drain terminals of the dummy transistor DMX, it may be possible to prevent or suppress a signal noise issue from occurring in the interconnection lines adjacent to the dummy transistor DMX.

Figure 9:
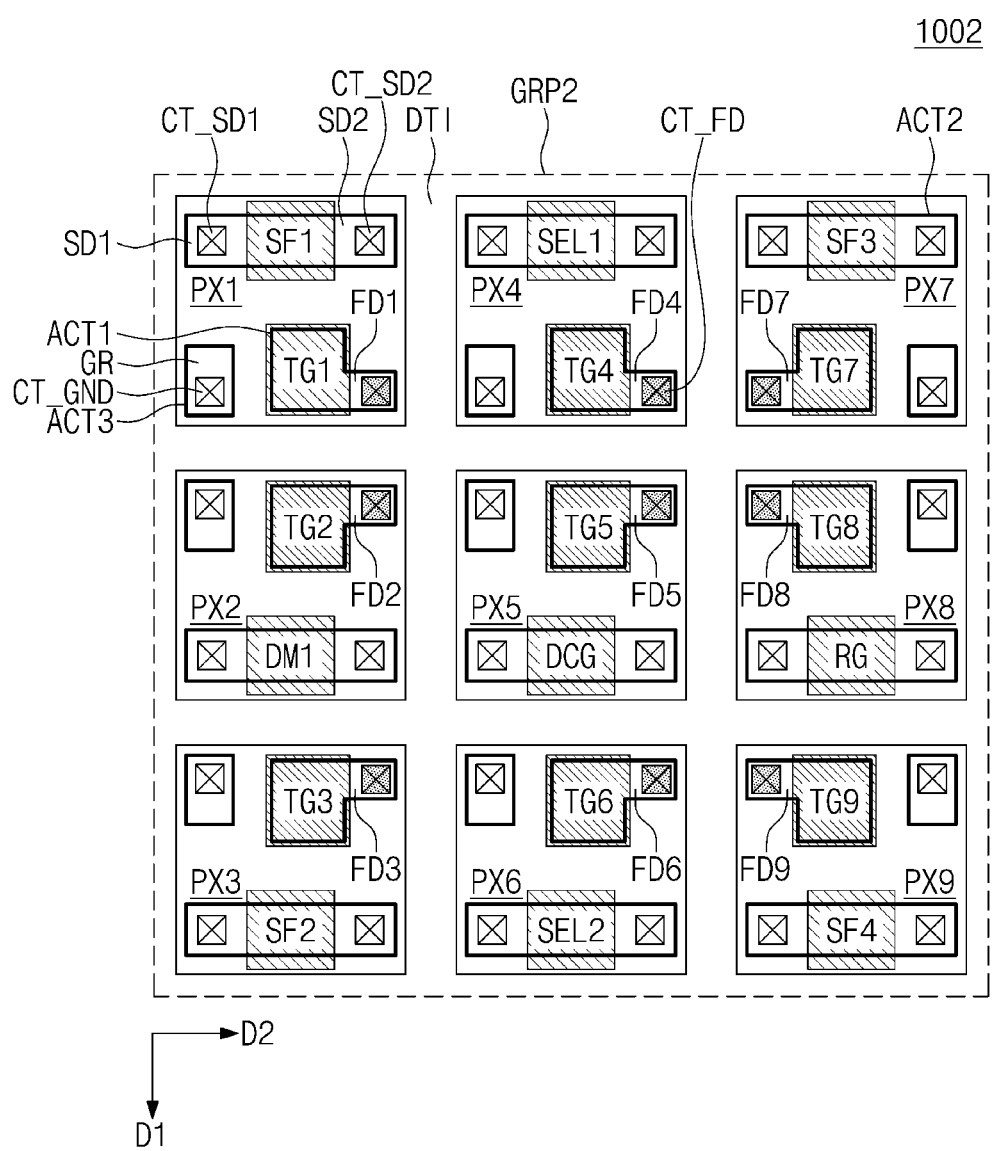
FIG. 9 is a layout diagram illustrating an image sensor according to an embodiment of the inventive concept.

FIG. 9 is a layout diagram illustrating an image sensor 1002 according to an embodiment of the inventive concept.

Referring to FIG. 9, in the second pixel group GRP2 of the image sensor 1002 according to the present embodiment, the first source follower gate SF1 may be disposed in the second active region ACT2 of the first pixel PX1. The first dummy gate DM1 may be disposed in the second active region ACT2 of the second pixel PX2. The second source follower gate SF2 may be disposed in the second active region ACT2 of the third pixel PX3. The first selection gate SEL1 may be disposed in the second active region ACT2 of the fourth pixel PX4. The dual conversion gate DCG may be disposed in the second active region ACT2 of the fifth pixel PX5. A second selection gate SEL2 may be disposed in the second active region ACT2 of the sixth pixel PX6. The third source follower gate SF3 may be disposed in the second active region ACT2 of the seventh pixel PX7. The reset gate RG may be disposed in the second active region ACT2 of the eighth pixel PX8. A fourth source follower gate SF4 may be disposed in the second active region ACT2 of the ninth pixel PX9. Except for the above features, the image sensor according to the present embodiment may be substantially the same as or similar to those in the previous embodiment described with reference to FIG. 4.

Figure 10:
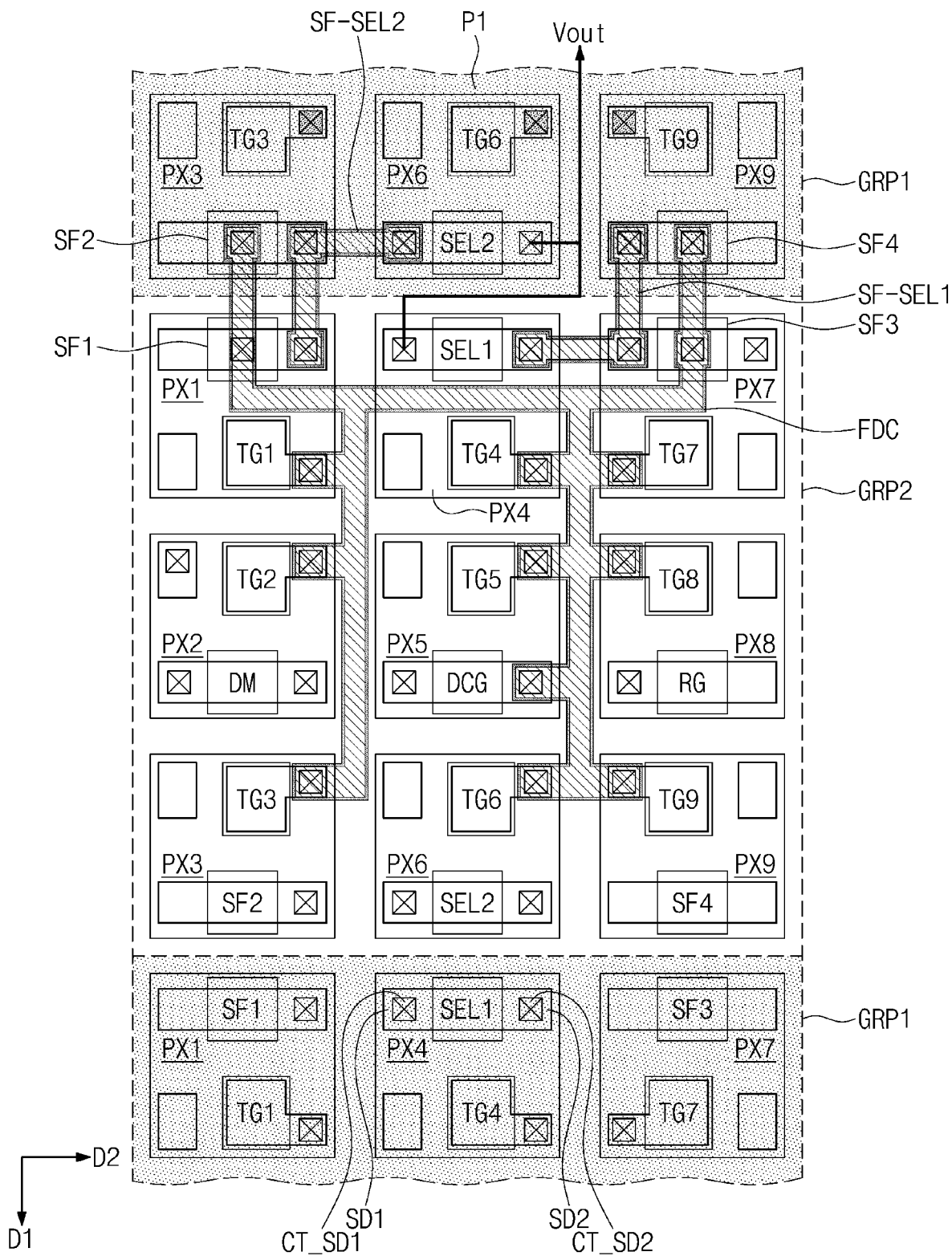
FIG. 10 is a plan view illustrating an interconnection structure of the image sensor of FIG. 9.
Figure 11:
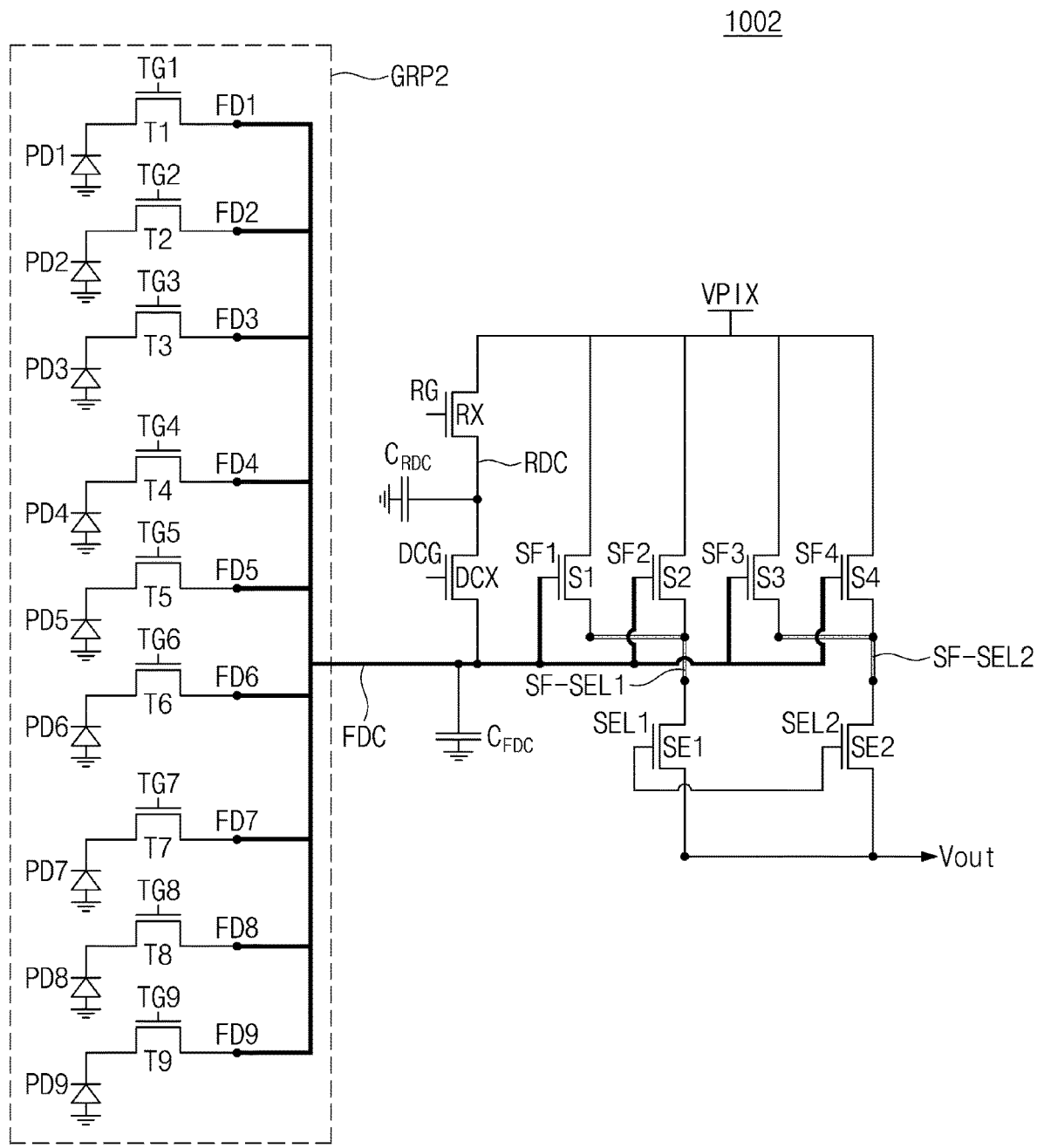
FIG. 11 is a circuit diagram of the image sensor of FIG. 10.

FIG. 10 is a plan view illustrating an interconnection structure of the image sensor of FIG. 9. In order to reduce complexity in the drawings and to provide better understanding of the inventive concept, some of the contacts may be omitted from FIG. 10. FIG. 11 is a circuit diagram of the image sensor of FIG. 10.

Referring to FIG. 10, for the image sensor 1002 according to the present embodiment, the first pixel groups GRP1 may be disposed at both sides (i.e., a first side and a second side) of the second pixel group GRP2 in the first direction D1. The first to ninth pixels PX and the transistors in the first pixel group GRP1 may be disposed in the same manner as those in the second pixel group GRP2 of FIG. 9. At the first side of the second pixel group GRP2, the third, sixth, and ninth pixels PX3, PX6, and PX9 of the first pixel group GRP1 may be placed directly adjacent to the first, fourth, and seventh pixels PX1, PX4, and PX7, respectively, of the second pixel group GRP2. The second source follower gate SF2 disposed in the third pixel PX3 of the first pixel group GRP1 may be placed directly adjacent to the first source follower gate SF1 disposed in the first pixel PX1 of the second pixel group GRP2. The second selection gate SEL2 disposed in the sixth pixel PX6 of the first pixel group GRP1 may be placed directly adjacent to the first selection gate SEL1 disposed in the fourth pixel PX4 of the second pixel group GRP2. The fourth source follower gate SF4 disposed in the ninth pixel PX9 of the first pixel group GRP1 may be placed directly adjacent to the third source follower gate SF3 disposed in the seventh pixel PX7 of the second pixel group GRP2. At the second side of the second pixel group GRP2, the first, fourth, and seventh pixels PX1, PX4, and PX7 of the first pixel group GRP1 may be placed directly adjacent to the third, sixth, and ninth pixels PX3, PX6, and PX9, respectively, of the second pixel group GRP2.

Referring to FIGS. 2A, 6A, and 10, the first to ninth floating diffusion regions FD1 to FD9 of the second pixel group GRP2 may be connected to the first and third source follower gates SF1 and SF3 of the second pixel group GRP2 and the second and fourth source follower gates SF2 and SF4 of the first pixel group GRP1 by the FD contacts CT_FD, the FD connection line FDC, and the SF contact CT_SF.

The FD contacts CT_FD may be provided to penetrate the first interlayer insulating layer ILD1 and to be in contact with the first to ninth floating diffusion regions FD1 to FD9 of the second pixel group GRP2. The SF contact CT_SF may be provided to penetrate the first interlayer insulating layer ILD1 and to be in contact with the first to fourth source follower gates SF1 to SF4. The FD connection line FDC may be disposed on the first interlayer insulating layer ILD1. The FD connection line FDC may be connected to the second source/drain region SD2 which is placed beside the dual conversion gate DCG in the fifth pixel PX5 of the second pixel group GRP2. The FD connection line FDC connecting the first to ninth floating diffusion regions FD1 to FD9 may have a shape of letter 'π'. The FD connection line FDC may be located at the same height as the first interconnection lines M1, and thus, connection lengths between the first to ninth floating diffusion regions FD1 to FD9 and the first to fourth source follower gates SF1 to SF4 may be relatively shortened. Accordingly, it may be possible to suppress an interference phenomenon (e.g., parasitic capacitance), which may occur between neighboring interconnection lines, and thereby to reduce a signal noise issue in the image sensor 1002.

The second source/drain region SD2 on the right of the first source follower gate SF1 of the second pixel group GRP2, the second source/drain region SD2 on the right of the second source follower gate SF2 of the first pixel group GRP1, and the first source/drain region SD1 on the left of the second selection gate SEL2 of the first pixel group GRP1 may be connected to each other by an SF-SEL2 line SF-SEL2. The first source/drain region SD1 on the left of the fourth source follower gate SF4 of the first pixel group GRP1, the first source/drain region SD1 on the left of the third source follower gate SF3 of the second pixel group GRP2, and the second source/drain region SD2 on the right of the first selection gate SEL1 of the second pixel group GRP2 may be connected to each other by an SF-SEL1 line SF-SEL1. When viewed in a plan view, each of the SF-SEL2 and SF-SEL1 lines SF-SEL2 and SF-SEL1 may have a shape of letter 'L'. In the present embodiment, since two selection transistors are arranged between four source follower transistors, it may be possible to prevent the lengths of the SF-SEL1 and SF-SEL2 lines SF-SEL1 and SF-SEL2 from being increased and thereby to reduce a signal noise issue in the image sensor 1002.

The first source/drain region SD1 on the left of the first selection gate SEL1 of the second pixel group GRP2 and the second source/drain region SD2 on the right of the second selection gate SEL2 of the first pixel group GRP1 may be connected in common to the output line Vout. The SF-SEL1 and SF-SEL2 lines SF-SEL1 and SF-SEL2 may be located at the same height as the FD connection line FDC. The SF-SEL2 line SF-SEL2 and the SF-SEL1 line SF-SEL1 may be located on the first interlayer insulating layer ILD1.

Since the selection gates SEL1 and SEL2 are disposed to be directly adjacent to first follower gate SF1 and the second follower gate SF2, and disposed to be directly adjacent to the third follower gate SF3 and the fourth follower gate SF4, the SF-SEL1 and SF-SEL2 lines SF-SEL1 and SF-SEL2 may have relatively very short lengths. For example, each of the SF-SEL1 and SF-SEL2 lines SF-SEL1 and SF-SEL2 may have the third width W3 in the first direction D1 and may have the fourth width W4 in the second direction D2, as described with reference to FIG. 7. The third width W3 may be smaller than the first width W1. The fourth width W4 may be smaller than the second width W2. In this case, the SF-SEL1 and SF-SEL2 lines SF-SEL1 and SF-SEL2 may have relatively very short lengths and thus, it may be possible to reduce a signal noise issue in the image sensor 1002.

Referring to FIG. 11, the first to fourth source follower transistors S1 to S4 may be connected in parallel. In addition, the first and second selection transistors SE1 and SE2 may also be connected in parallel. Except for the above features, the image sensor according to the present embodiment may be substantially the same or similar structure as that in the previous embodiment described with reference to FIG. 8A.

Figure 12:
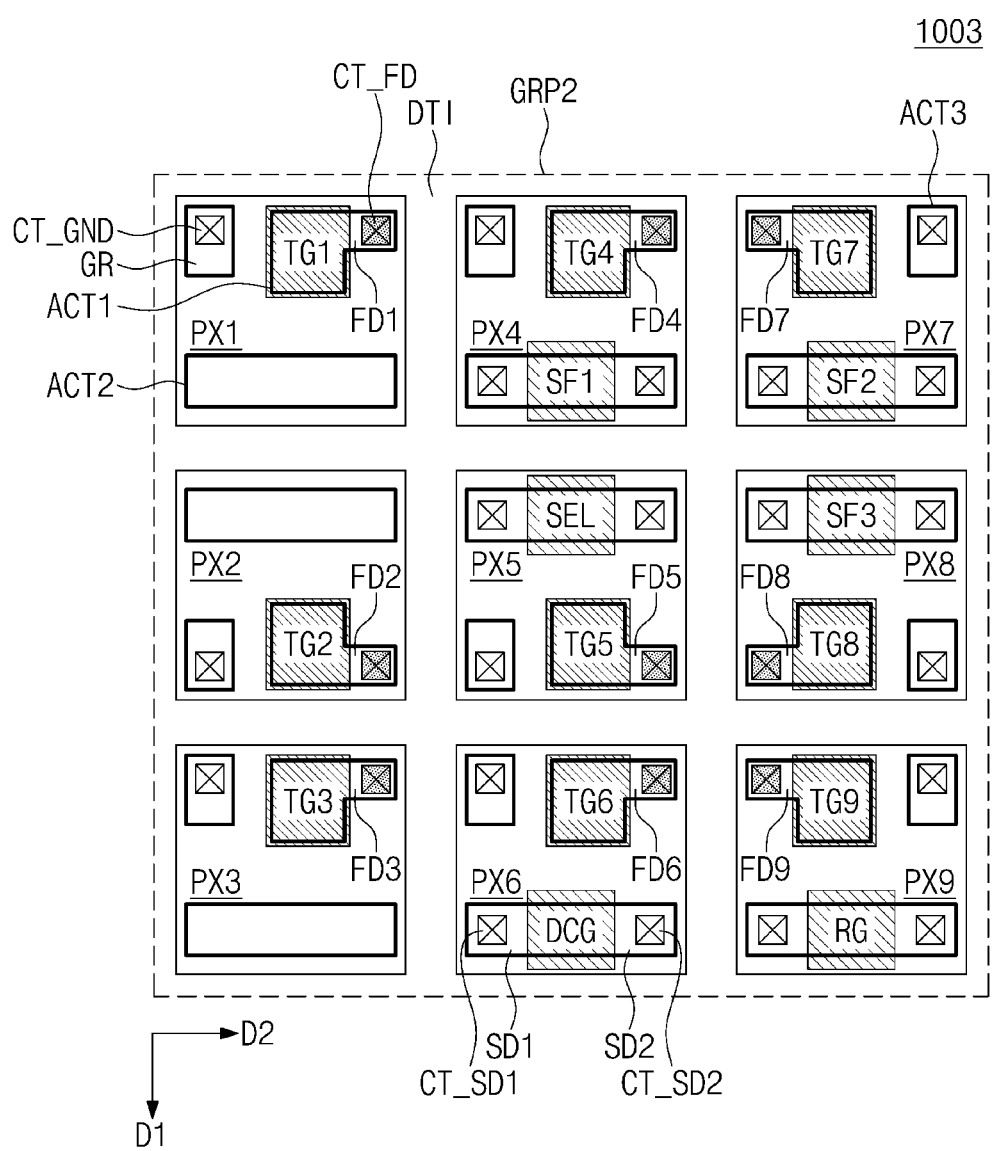
FIG. 12 is a layout diagram illustrating an image sensor according to an embodiment of the inventive concept.

FIG. 12 is a layout diagram illustrating an image sensor 1003 according to an embodiment of the inventive concept.

Referring to FIG. 12, the image sensor 1003 according to the present embodiment may not include the dummy gates DM1 to DM3 of FIG. 4. Any of the gate electrodes described with reference to FIGS. 1A and 1B may not be disposed on the second active regions ACTs of the first to third pixels PX1 to PX3, and the source/drain regions, the SD contacts, and the GE contacts may also not be disposed. The second, fifth, and eighth pixels PX2, PX5, and PX8 may be disposed to have mirror symmetry with respect to the third, sixth, and ninth pixels PX3, PX6, and PX9 about a line/axis extending in the first direction D2. The first source follower gate SF1 may be disposed in the second active region ACT2 of the fourth pixel PX4. The selection gate SEL may be disposed in the second active region ACT2 of the fifth pixel PX5. The dual conversion gate DCG may be disposed in the second active region ACT2 of the sixth pixel PX6. The second source follower gate SF2 may be disposed in the second active region ACT2 of the seventh pixel PX7. The third source follower gate SF3 may be disposed in the second active region ACT2 of the eighth pixel PX8. The reset gate RG may be disposed in the second active region ACT2 of the ninth pixel PX9.

Figure 13:
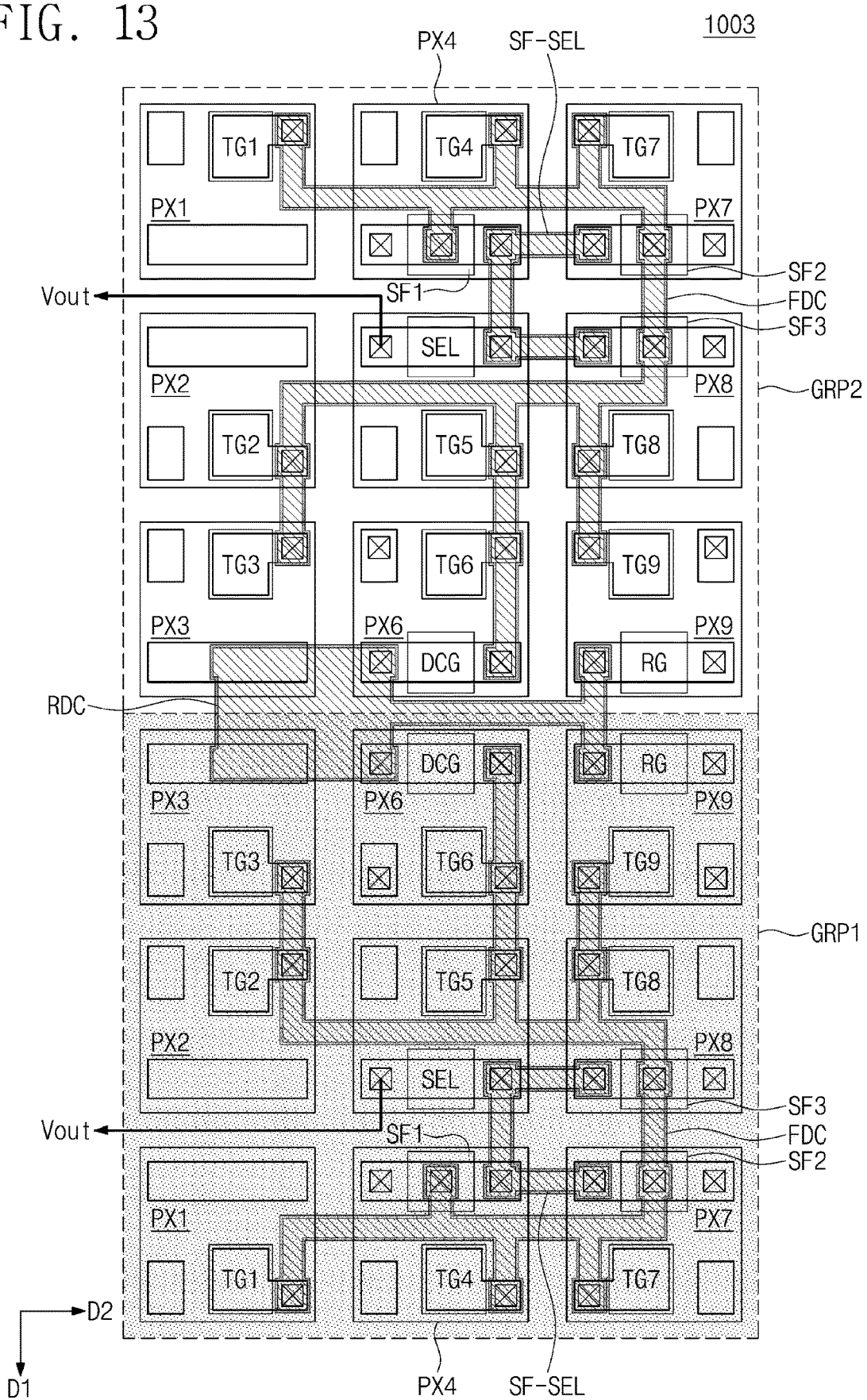
FIG. 13 is a plan view illustrating an interconnection structure of the image sensor of FIG. 12.
Figure 14:
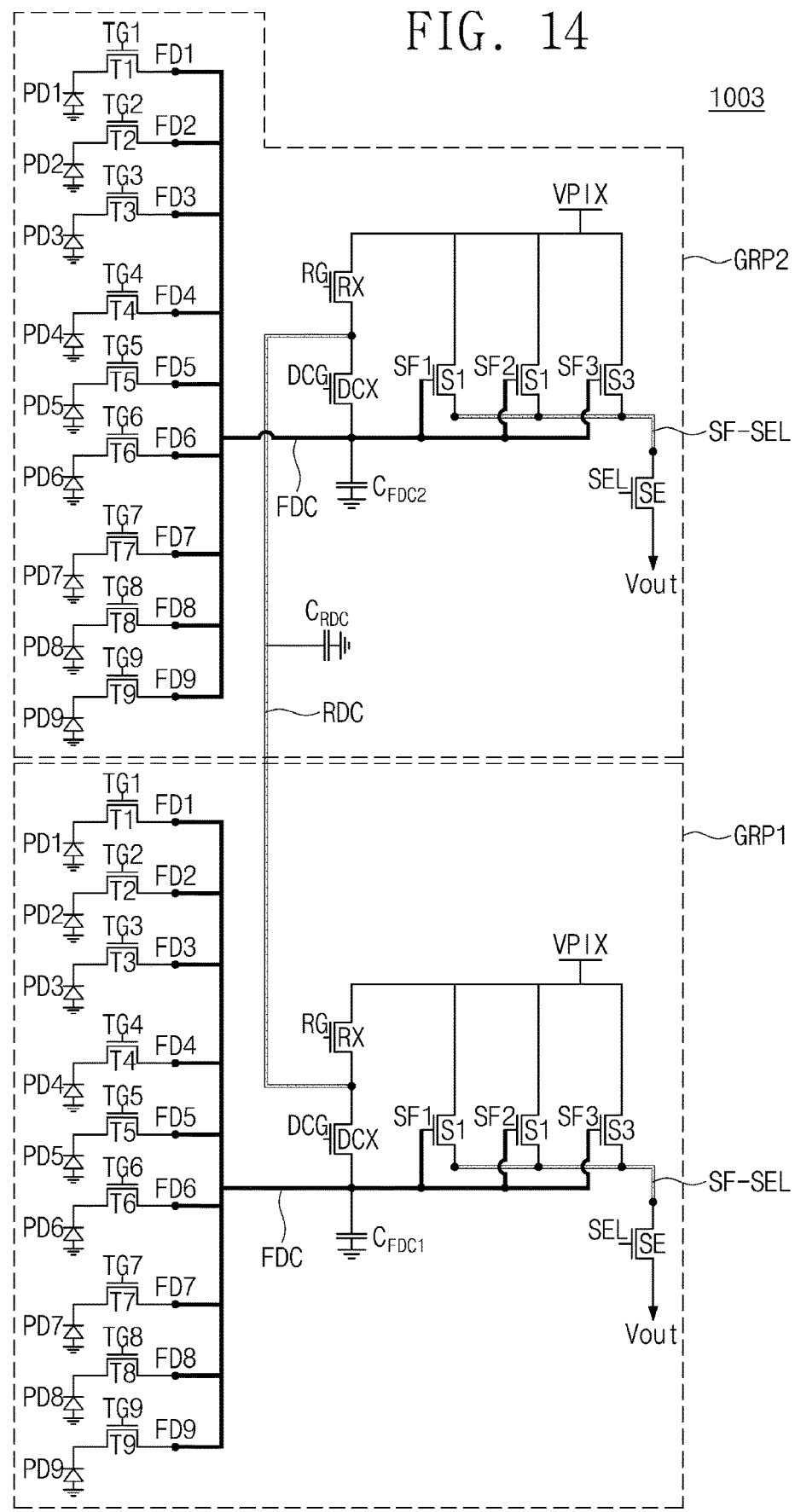
FIG. 14 is a circuit diagram of the image sensor of FIG. 13.

FIG. 13 is a plan view illustrating an interconnection structure of the image sensor 1003 of FIG. 12. In order to reduce complexity in the drawings and to provide better understanding of the inventive concept, some of the contacts may be omitted from FIG. 12. FIG. 14 is a circuit diagram of the image sensor 1003 of FIG. 13.

Referring to FIGS. 13 and 14, the second pixel group GRP2 and the first pixel group GRP1 may be disposed side by side in the first direction D1. The pixels PX1 to PX9 and the transistors of the second pixel group GRP2 may be arranged in the same manner as FIG. 12. The pixels PX1 to PX9 and the transistors in the first pixel group GRP1 may be disposed in a mirror symmetric manner with respect to the second pixel group GRP2. That is, the first pixel group GRP1 may have the following arrangement.

In the first pixel group GRP1, the third, second, and first pixels PX3, PX2, and PX1 may be sequentially arranged in the first direction D1 to constitute a first column. The sixth, fifth, and fourth pixels PX6, PX5, and PX4 may be sequentially arranged in the first direction D1 to constitute a second column. The ninth, eighth, and seventh pixels PX9, PX8, and PX7 may be sequentially arranged in the first direction D1 to constitute a third column. Thus, the third, sixth, and ninth pixels PX3, PX6, and PX9 of the second pixel group GRP2 may be directly adjacent to the third, sixth, and ninth pixels PX3, PX6, and PX9, respectively, of the first pixel group GRP1. The dual conversion gates DCG of the first and second pixel groups GRP1 and GRP2 may be directly adjacent to each other. The reset gates RG of the first and second pixel groups GRP1 and GRP2 may be directly adjacent to each other.

Referring to FIGS. 2A, 6A, and 13, the first to ninth floating diffusion regions FD1 to FD9 of the second pixel group GRP2 may be connected to the first to third source follower gates SF1 to SF3 of the second pixel group GRP2 by the FD contacts CT_FD, the FD connection line FDC, and the SF contact CT_SF. The FD connection line FDC may be connected to the second source/drain region SD2 on the right of the dual conversion gate DCG, which is disposed in the sixth pixel PX6 of the second pixel group GRP2. In the second pixel group GRP2, the second source/drain region SD2 on the right of the first source follower gate SF1, the first source/drain region SD1 on the left of the second source follower gate SF2, the first source/drain region SD1 on the left of the third source follower gate SF3, and the second source/drain region SD2 on the right of the selection gate SEL may be connected to each other by the SF-SEL line SF-SEL. When viewed in a plan view, the SF-SEL line SF-SEL may have a shape of letter 'C'. In the present embodiment, the FD connection line FDC may be provided to partially enclose the SF-SEL line SF-SEL, when viewed in a plan view. The first source/drain region SD1 on the left of the selection gate SEL may be connected to the output line Vout. The shapes of the FD connection line FDC and the SF-SEL line SF-SEL in the first pixel group GRP1 may be mirror symmetric with respect to the second pixel group GRP2. For example, a line/axis of symmetry may extend in the second direction D2 along an interface between the first pixel group GRP1 and the second pixel group GRP2.

In the second pixel group GRP2, the first source/drain region SD1 on the left of the dual conversion gate DCG and the first source/drain region SD1 on the left of the reset gate RG may be connected to each other through the RD connection line RDC. The RD connection line RDC may be extended to the first pixel group GRP1 to connect the first source/drain region SD1 on the left of the dual conversion gate DCG to the first source/drain region SD1 on the left of the reset gate RG in the first pixel group GRP1. When viewed in a plan view, the RD connection line RDC may have a mirror symmetric shape about the interface between the first pixel group GRP1 and the second pixel group GRP2. In the present specification, the RD connection line RDC may be referred to as a reset transistor-dual conversion transistor connection line.

In the present embodiment, since the dummy gates are not disposed on the third pixels PX3 of the first and second pixel groups GRP1 and GRP2, it may be possible to prevent a coupling or parasitic capacitance issue by the dummy gates. Accordingly, the RD connection line RDC may be extended to a region on the third pixels PX3 of the first and second pixel groups GRP1 and GRP2. Thus, a surface area of the RD connection line RDC may be increased. This may make it possible to increase the capacitance $C_{RDC}$ of the RD connection line RDC, as shown in FIG. 14. As a result, the FWC property of the first and/or second pixel group GRP1 and/or GRP2 may be improved, under a high brightness condition.

Furthermore, in the present embodiment, terminals of the dual conversion transistors DCX and the reset transistors RX in the first and second pixel groups GRP1 and GRP2 may be connected in common to the RD connection line RDC. The capacitance of the FD connection line of the first pixel group GRP1 may be $C_{FDC1}$. The capacitance of the FD connection line of the second pixel group GRP2 may be $C_{FDC2}$. In this case, by independently turning on or off each of the dual conversion transistors DCX of the first and second pixel groups GRP1 and GRP2, it may be possible to further increase the capacitance and thereby to increase a variable range of conversion gain. For example, when all of the transfer transistors T1 to T9 of the second pixel group GRP2 are turned on and all of the transfer transistors T1 to T9 of the first pixel group GRP1 are turned off, by turning on all of the dual conversion transistors DCX of the first and second pixel groups GRP1 and GRP2, it may be possible to increase a change amount in FWC of the second pixel group GRP2 to $C_{FDC2}+C_{RDC}+C_{FDC1}$.

As described above, the RD connection line RDC may be used to connect adjacent ones (e.g., GRP1 to GRP3 of FIG. 3) of the pixel groups, and the operations of the dual conversion transistors DCX and the transfer transistors T1 to T9 in each of the pixel groups GRP1 to GRP3 may be controlled to increase the change amount of FWC or to change the dual conversion gain variously (e.g., by 1, 2, 3, 4 times or the like).

Figure 15:
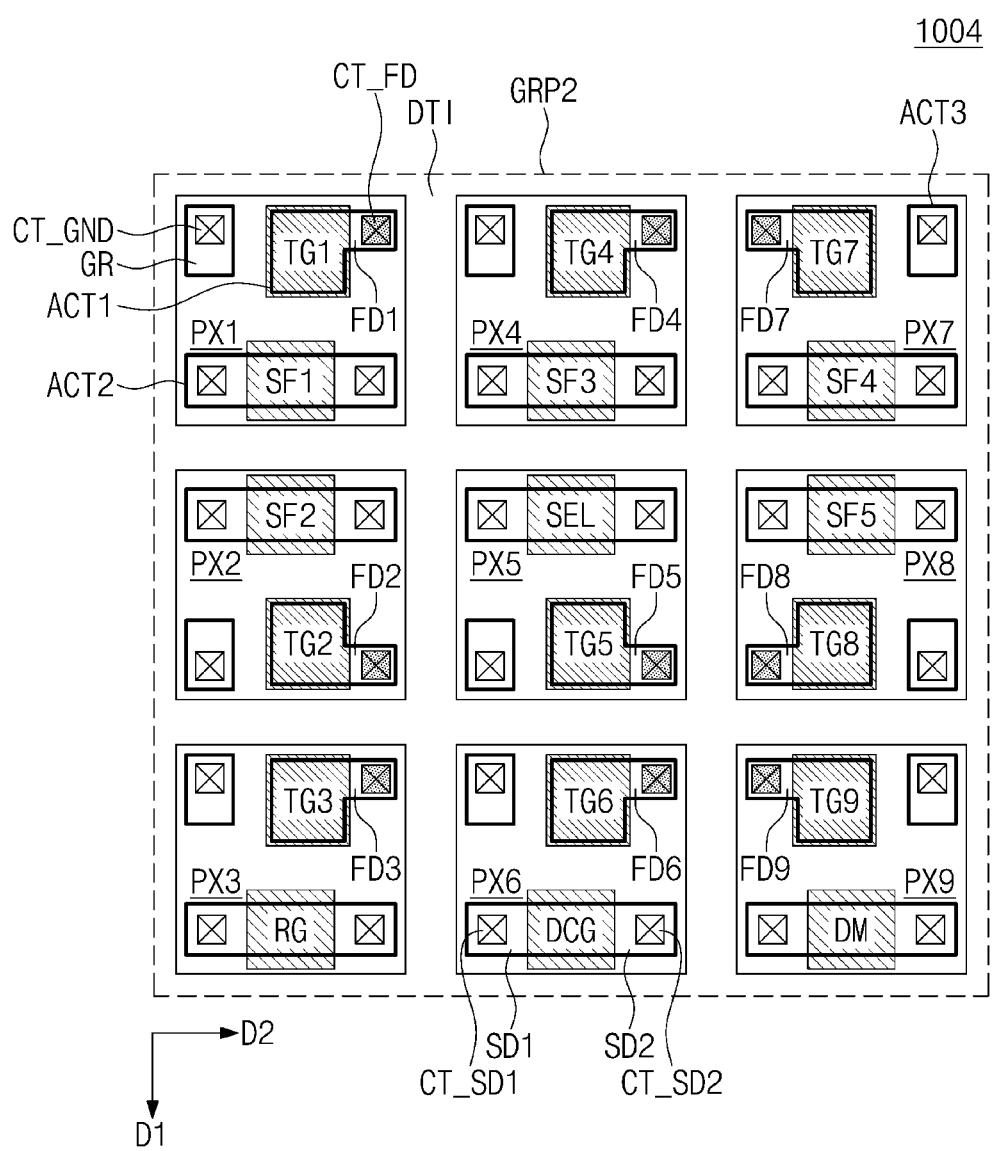
FIG. 15 is a layout diagram illustrating an image sensor according to an embodiment of the inventive concept.

FIG. 15 is a layout diagram illustrating an image sensor 1004 according to an embodiment of the inventive concept.

Referring to FIG. 15, for the image sensor 1004 according to the present embodiment, in the second pixel group GRP2, the first source follower gate SF1 may be disposed on the second active region ACT2 of the first pixel PX1. The second source follower gate SF2 may be disposed on the second active region ACT2 of the second pixel PX2. The reset gate RG may be disposed on the second active region ACT2 of the third pixel PX3. The third source follower gate SF3 may be disposed on the second active region ACT2 of the fourth pixel PX4. The selection gate SEL may be disposed on the second active region ACT2 of the fifth pixel PX5. The dual conversion gate DCG may be disposed on the second active region ACT2 of the sixth pixel PX6. The fourth source follower gate SF4 may be disposed on the second active region ACT2 of the seventh pixel PX7. The fifth source follower gate SF5 may be disposed on the second active region ACT2 of the eighth pixel PX8. A dummy gate DM may be disposed on the second active region ACT2 of the ninth pixel PX9. Except for the above features, the image sensor according to the present embodiment may be substantially the same or similar structure as that in the previous embodiment described with reference to FIG. 12.

Figure 16:
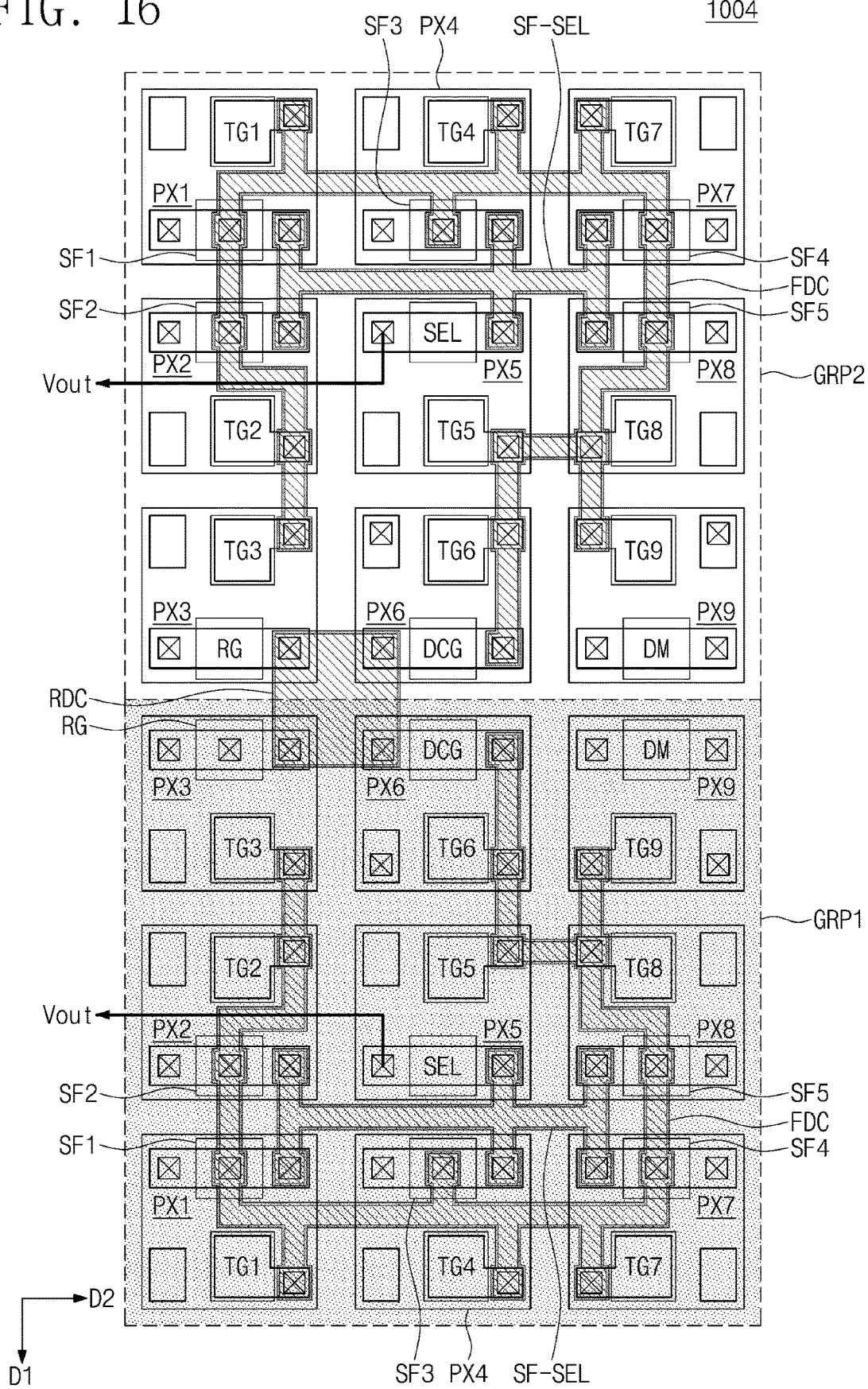
FIG. 16 is a plan view illustrating an interconnection structure of the image sensor of FIG. 15.
Figure 17:
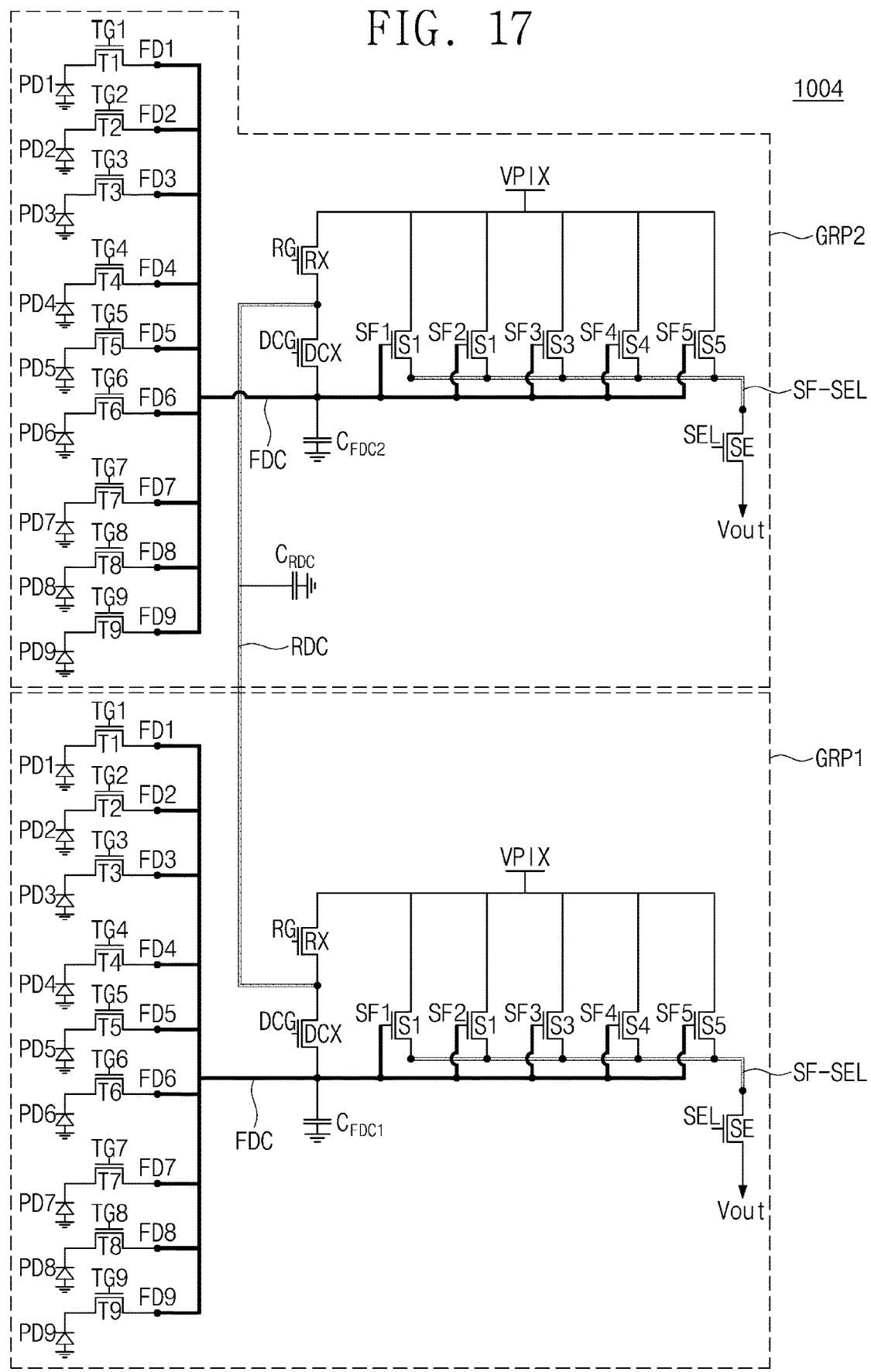
FIG. 17 is a circuit diagram of the image sensor of FIG. 16.

FIG. 16 is a plan view illustrating an interconnection structure of the image sensor of FIG. 15. In order to reduce complexity in the drawings and to provide better understanding of the inventive concept, some of the contacts may be omitted from FIG. 15. FIG. 17 is a circuit diagram of the image sensor of FIG. 16.

Referring to FIGS. 16 and 17, the second pixel group GRP2 and the first pixel group GRP1 may be disposed side by side in the first direction D1. The pixels PX1 to PX9 and the transistors of the second pixel group GRP2 may be disposed in the same manner as FIG. 15. The pixels PX1 to PX9 and the transistors in the first pixel group GRP1 may be disposed in the mirror-symmetric manner with the second pixel group GRP2, as described with reference to FIG. 13. For example, a line/axis of symmetry may extend in the second direction D2 along an interface between the first pixel group GRP1 and the second pixel group GRP2.

Referring to FIGS. 2A, 6A, and 16, the first to ninth floating diffusion regions FD1 to FD9 of the second pixel group GRP2 may be connected to the first to fifth source follower gates SF1 to SF5 of the second pixel group GRP2 by the FD contacts CT_FD, the FD connection line FDC, and the SF contact CT_SF. The FD connection line FDC may be connected to the second source/drain region SD2 on the right of the dual conversion gate DCG, which is disposed in the sixth pixel PX6 of the second pixel group GRP2. In the second pixel group GRP2, the second source/drain region SD2 on the right of the first source follower gate SF1, the second source/drain region SD2 on the right of the second source follower gate SF2, the second source/drain region SD2 on the right of the third source follower gate SF3, the first source/drain region SD1 on the left of the fourth source follower gate SF4, the first source/drain region SD1 on the left of the fifth source follower gate SF5, and the second source/drain region SD2 on the right of the selection gate SEL may be connected to each other by the SF-SEL line SF-SEL. In the present embodiment, the FD connection line FDC may be provided to enclose the SF-SEL line SF-SEL, when viewed in a plan view. The first source/drain region SD1 on the left of the selection gate SEL may be connected to the output line Vout. The shapes of the FD connection line FDC and the SF-SEL line SF-SEL in the first pixel group GRP1 may be mirror symmetric with respect to the shapes of the FD connection line FDC and the SF-SEL line SF-SEL in the second pixel group GRP2. For example, a line/axis of symmetry may extend in the second direction D2 along an interface between the first pixel group GRP1 and the second pixel group GRP2.

In the second pixel group GRP2, the first source/drain region SD1 on the left of the dual conversion gate DCG and the second source/drain region SD2 on the right of the reset gate RG may be connected to each other through the RD connection line RDC. The RD connection line RDC may be extended to the first pixel group GRP1 to connect the first source/drain region SD1 on the left of the dual conversion gate DCG to the first source/drain region SD1 on the right of the reset gate RG in the first pixel group GRP1. When viewed in a plan view, the RD connection line RDC may have a mirror symmetric shape about an interface between the first pixel group GRP1 and the second pixel group GRP2. The RD connection line RDC may have a square or rectangular shape, when viewed in a plan view. The RD connection line RDC may have a width, which is smaller than that of one pixel PX, in the first and second directions D1 and D2, and thus, it may be possible to reduce a signal noise in the image sensor. In addition, since the RD connection line RDC has a square or rectangular shape when viewed in a plan view, it may have a surface area that is larger than that of a line-shaped interconnection line, and thus, as shown in FIG. 17, the capacitance $C_{RDC}$ of the RD connection line RDC may be increased. As a result, the FWC property of the first and/or second pixel group GRP1 and/or GRP2 may be improved, under a high brightness condition.

Furthermore, in the present embodiment, the first to fifth source follower transistors S1 to S5 may be connected in parallel to each other to form a fingered-type source follower transistor. The larger the number of the source follower transistors connected in parallel, the smaller the signal noise. Except for the above features, the structure and the operation of the image sensor may be substantially the same as or similar to those in the previous embodiments described with reference to FIGS. 13 and 14.

If the first and second pixel groups GRP1 and GRP2, which are directly adjacent to each other in FIG. 16, are chosen as a unit group, the unit group may include pixels which are arranged to form six rows and three columns or to form a 6×3 array. The reset gates RG and the dual conversion gates DCG may be disposed directly adjacent to a center of the unit group (i.e., a boundary of the first and second pixel groups GRP1 and GRP2) or in the third and fourth rows. In addition, the selection gates SEL may be disposed adjacent to an edge of the unit group or in the second and fifth rows.

Figure 18:
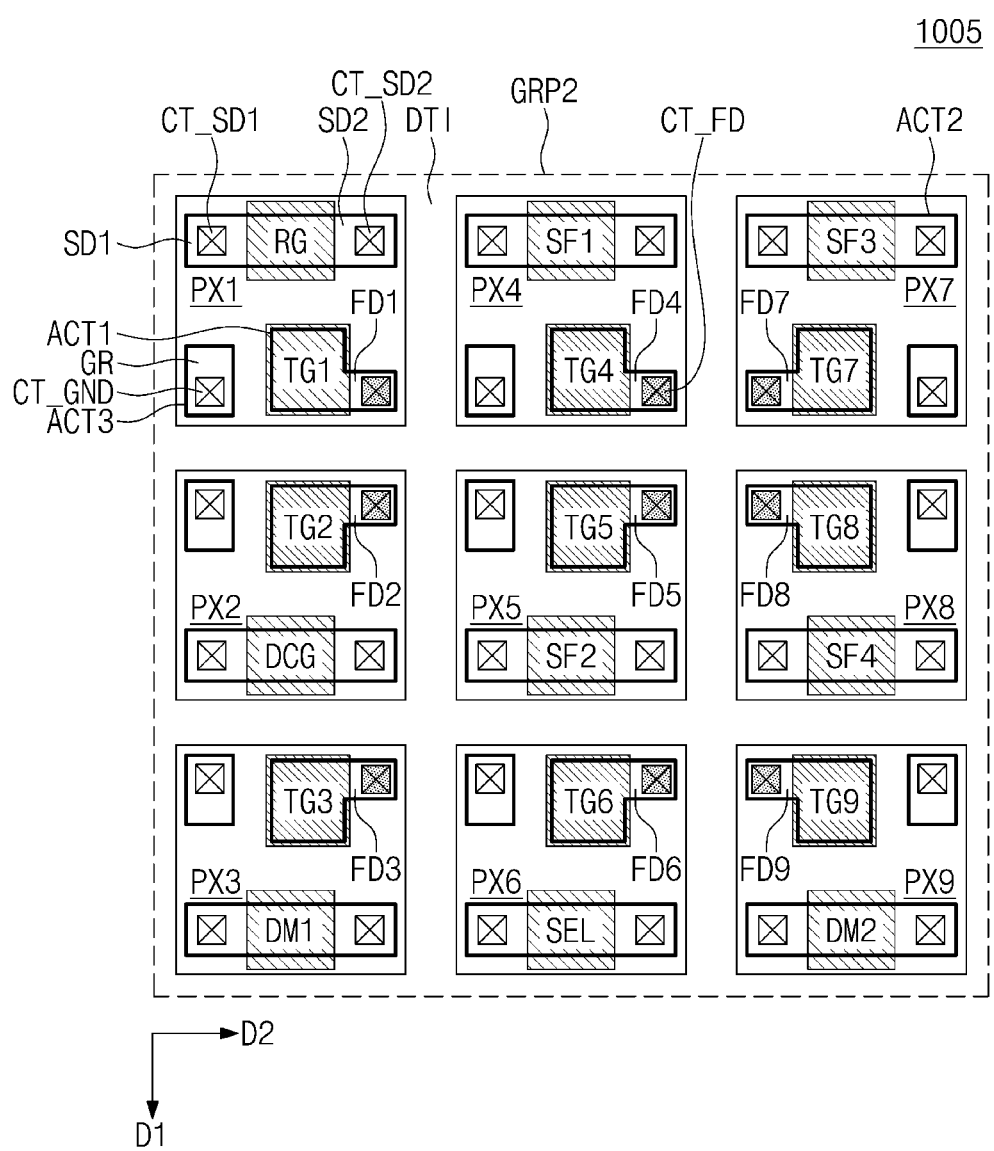
FIG. 18 is a layout diagram illustrating an image sensor according to an embodiment of the inventive concept.

FIG. 18 is a layout diagram illustrating an image sensor 1005 according to an embodiment of the inventive concept.

Referring to FIG. 18, for the image sensor 1005 according to the present embodiment, in the second pixel group GRP2, the reset gate RG may be disposed on the second active region ACT2 of the first pixel PX1. The dual conversion gate DCG may be disposed on the second active region ACT2 of the second pixel PX2. The first dummy gate DM1 may be disposed on the second active region ACT2 of the third pixel PX3. The first source follower gate SF1 may be disposed on the second active region ACT2 of the fourth pixel PX4. The second source follower gate SF2 may be disposed on the second active region ACT2 of the fifth pixel PX5. The selection gate SEL may be disposed on the second active region ACT2 of the sixth pixel PX6. The third source follower gate SF3 may be disposed on the second active region ACT2 of the seventh pixel PX7. The fourth source follower gate SF4 may be disposed on the second active region ACT2 of the eighth pixel PX8. The second dummy gate DM2 may be disposed on the second active region ACT2 of the ninth pixel PX9. Except for the above features, the image sensor according to the present embodiment may be substantially the same or similar structure as that in the previous embodiment described with reference to FIG. 4. In the image sensor 1005 according to the present embodiment, the pixels and the transistors of the second pixel group GRP2 may be arranged in the same manner as the first and third pixel groups GRP1 and GRP3 of FIG. 3. That is, in the image sensor 1005 according to the present embodiment, the pixels and the transistors of the second pixel group GRP2 may be periodically or repeatedly arranged in the first and second directions D1 and D2.

Figure 19:
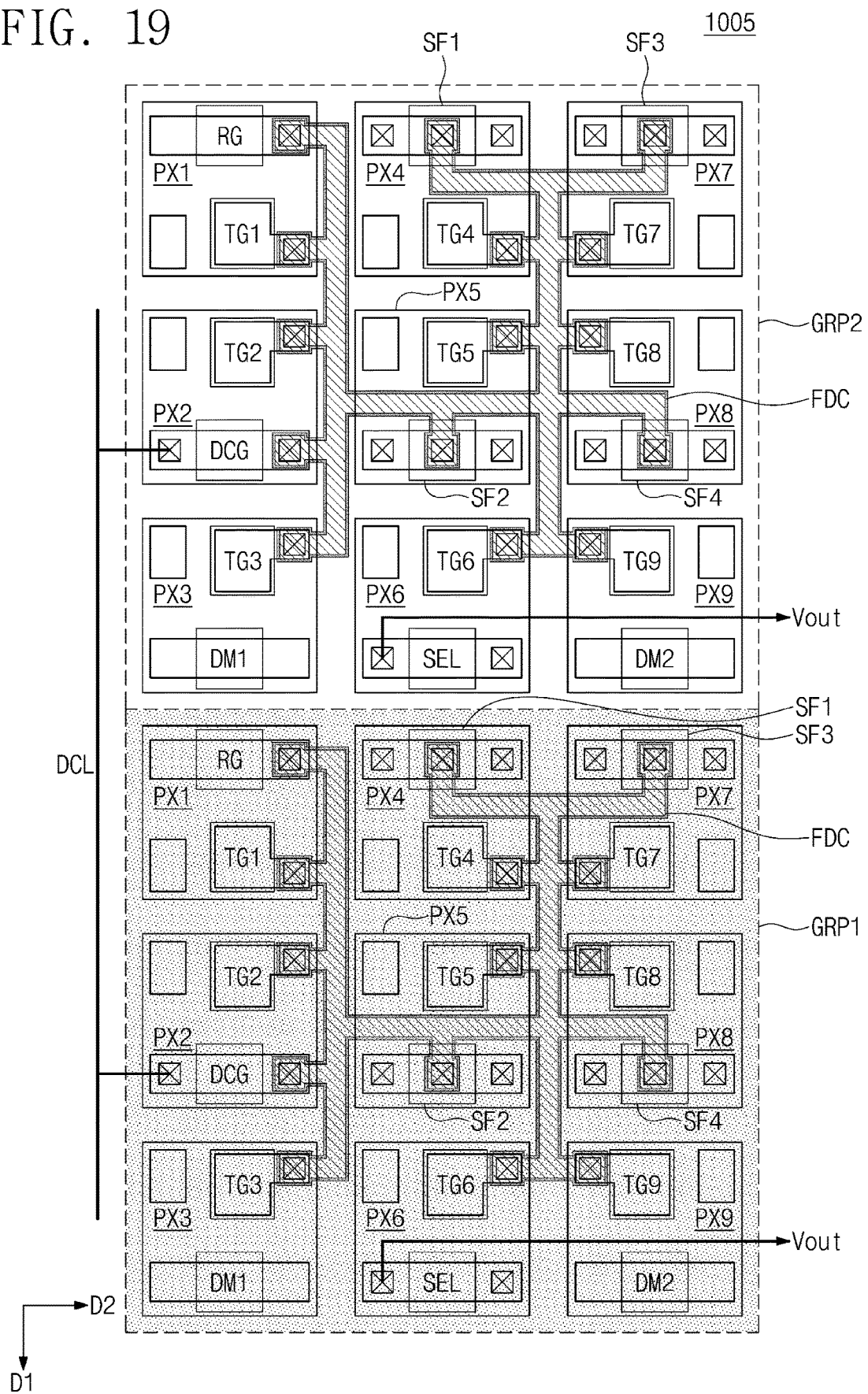
FIG. 19 is a plan view illustrating an interconnection structure of the image sensor of FIG. 18.
Figure 20:
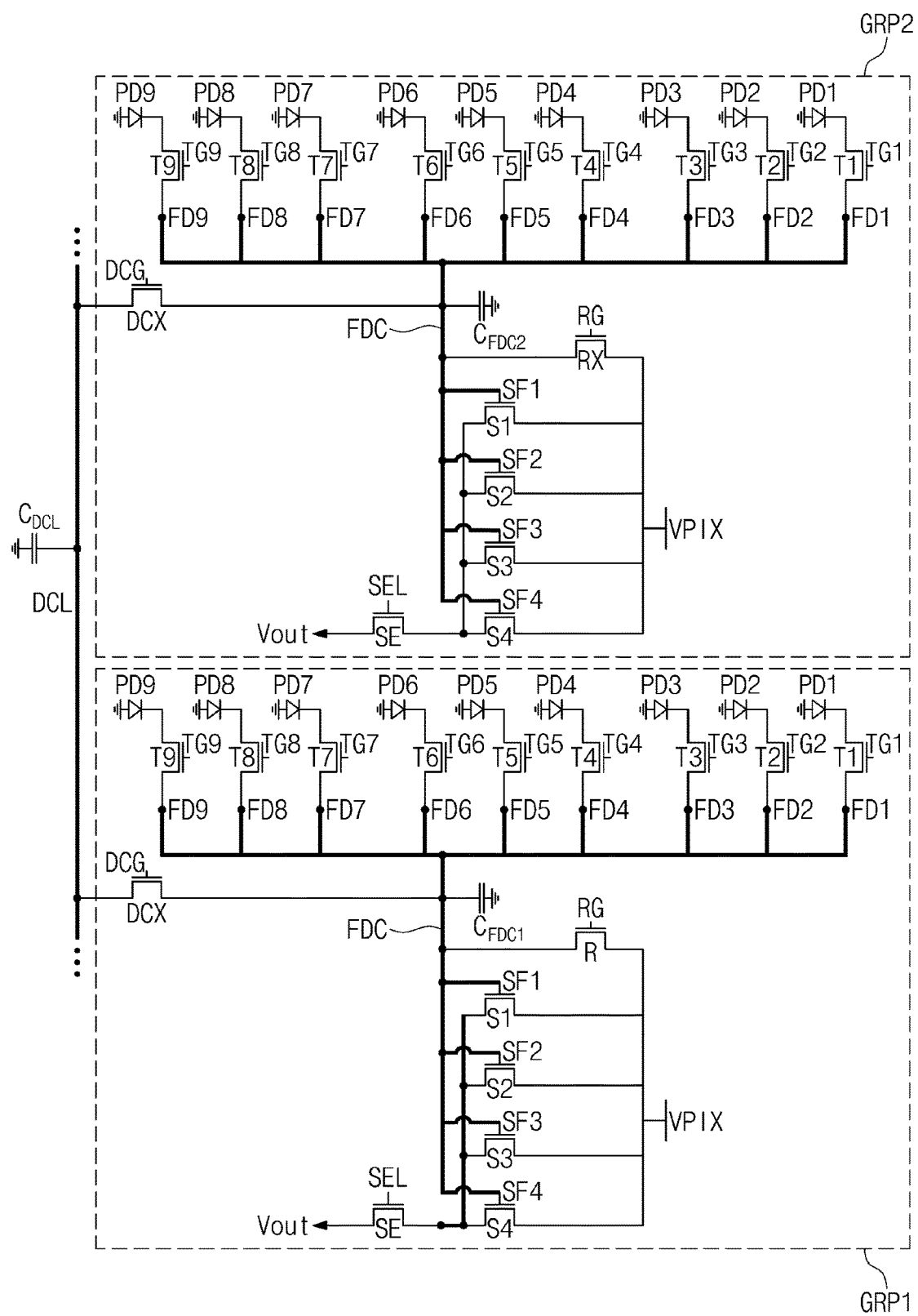
FIG. 20 is a circuit diagram of the image sensor of FIG. 19.

FIG. 19 is a plan view illustrating an interconnection structure of the image sensor 1005 of FIG. 18. In order to reduce complexity in the drawings and to provide better understanding of the inventive concept, some of the contacts may be omitted from FIG. 18. FIG. 20 is a circuit diagram of the image sensor of FIG. 19.

Referring to FIGS. 19 and 20, the second pixel group GRP2 and the first pixel group GRP1 may be disposed side by side in the first direction D1. In each of the first and second pixel groups GRP1 and GRP2, the pixels PX1 to PX9 and the transistors may be disposed in the same manner as FIG. 18.

Referring to FIGS. 2A, 6A, and 19, the first to ninth floating diffusion regions FD1 to FD9 of the second pixel group GRP2 may be connected to the first to fourth source follower gates SF1 to SF4 of the second pixel group GRP2 by the FD contacts CT_FD, the FD connection line FDC, and the SF contact CT_SF. The FD connection line FDC may be connected to the second source/drain region SD2 on the right of the reset gate RG disposed in the first pixel PX1 of the second pixel group GRP2. When viewed in a plan view, the FD connection line FDC may have a cross shape between the fifth pixel PX5 and the eighth pixel PX8. The FD connection line FDC in the first pixel group GRP1 may also have the same shape as the FD connection line FDC in the second pixel group GRP2. The first source/drain region SD1 on the left of the selection gate SEL may be connected to the output line Vout.

The first source/drain region SD1 on the left of the dual conversion gate DCG of the second pixel group GRP2 may be connected to the first source/drain region SD1 on the left of the dual conversion gate DCG of the first pixel group GRP1 by a DCL line DCL. In the present specification, the DCL line DCL may be referred to as a dual conversion transistor connection line. The DCL line DCL may have a capacitance $C_{DCL}$.

Terminals of the dual conversion transistors DCX of the first and second pixel groups GRP1 and GRP2 may be connected in common to the DCL line DCL. The capacitance of the FD connection line of the first pixel group GRP1 may be $C_{FDC1}$. The capacitance of the FD connection line of the second pixel group GRP2 may be $C_{FDC2}$. In this case, by independently turning on or off each of the dual conversion transistors DCX of the first and second pixel groups GRP1 and GRP2, it may be possible to further increase the capacitance and thereby to increase a variable range of conversion gain. For example, when all of the transfer transistors T1 to T9 of the second pixel group GRP2 are turned on and all of the transfer transistors T1 to T9 of the first pixel group GRP1 are turned off, by turning on all of the dual conversion transistors DCX of the first and second pixel groups GRP1 and GRP2, it may be possible to increase a change amount in FWC of the second pixel group GRP2 to $C_{FDC2}+C_{DCL}+C_{FDC1}$.

As described above, the DCL line DCL may be used to connect adjacent ones (e.g., GRP1 to GRP3 of FIG. 3) of the pixel groups, and the operations of the dual conversion transistors DCX and the transfer transistors T1 to T9 in each of the pixel groups GRP1 to GRP3 may be controlled to increase the change amount of FWC or to change the dual conversion gain variously (e.g., by 1, 2, 3, 4 times or the like). Except for the above features, the structure and the operation of the image sensor may be substantially the same as or similar to those in the previous embodiments described with reference to FIGS. 5, 8A, and 8B.

Figure 21:
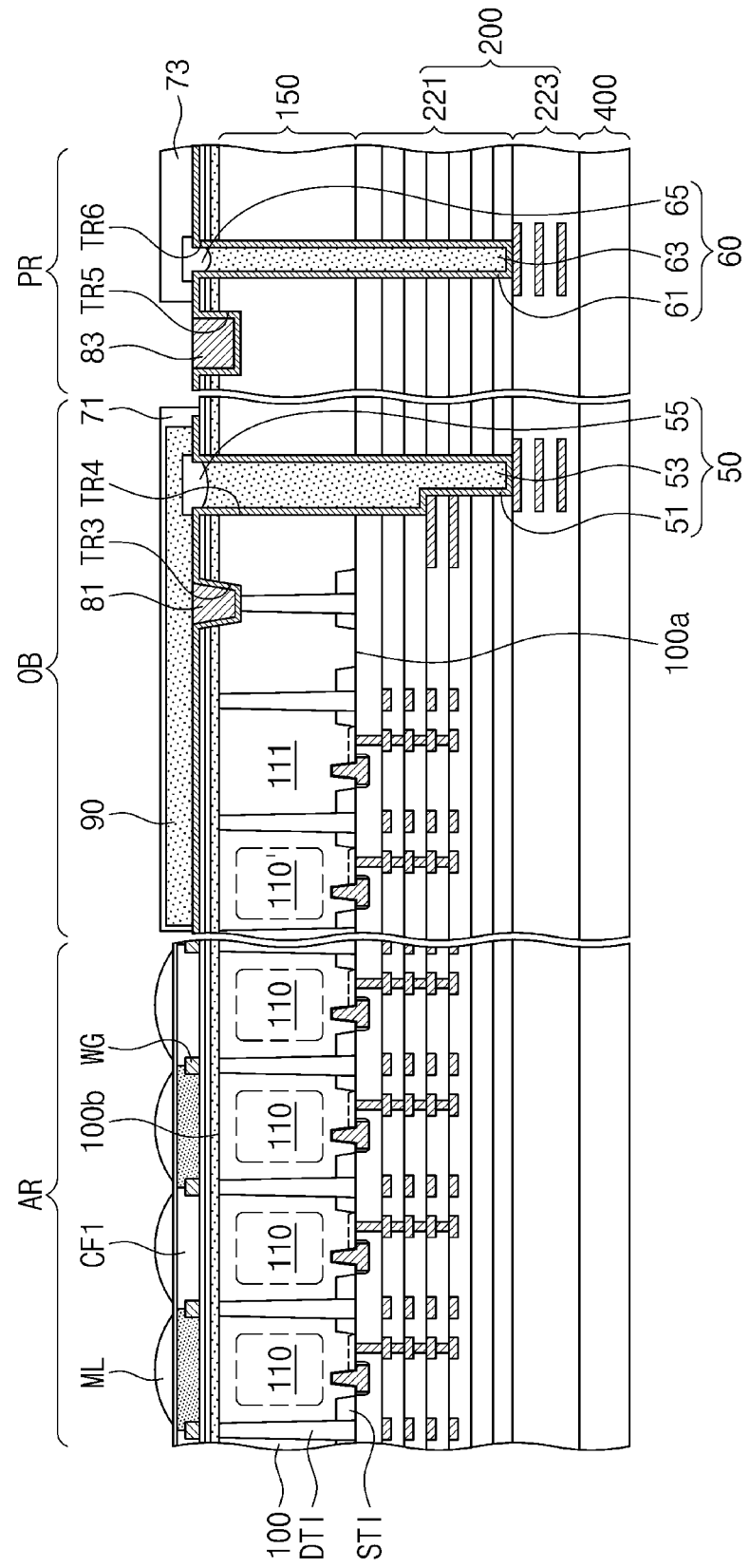
FIG. 21 is a sectional view illustrating an image sensor according to an embodiment of the inventive concept.

FIG. 21 is a sectional view illustrating an image sensor according to an embodiment of the inventive concept.

Referring to FIG. 21, an image sensor according to an embodiment of the inventive concept may include a substrate 100 having a pixel array region AR, an optical black region OB, and a pad region PR, an interconnection layer 200 on a first surface 100a of the substrate 100, and a base substrate 400 on the interconnection layer 200. The interconnection layer 200 may include an upper interconnection layer 221 and a lower interconnection layer 223. The pixel array region AR may include a plurality of the pixels PX. The pixels PX, which are disposed in the pixel array region AR, may be substantially the same as those described with reference to FIGS. 1A to 20.

A first connection structure 50, a first conductive pad 81, and a bulk color filter 90 may be provided on the optical black region OB of the substrate 100. The first connection structure 50 may include a first light-blocking pattern 51, an insulating pattern 53, and a first capping pattern 55.

The first light-blocking pattern 51 may be provided on a second surface 100b of the substrate 100. More specifically, the first light-blocking pattern 51 may be provided to cover the anti-reflection layer 42 on the second surface 100b and to conformally cover inner surfaces of third and fourth trenches TR3 and TR4. The first light-blocking pattern 51 may be provided to penetrate a photoelectric conversion layer 150 and the upper interconnection layer 221 and to connect the photoelectric conversion layer 150 to the interconnection layer 200. More specifically, the first light-blocking pattern 51 may be in contact with interconnection lines, which are provided in the upper and lower interconnection layers 221 and 223, and the conductive isolation pattern 10 of the pixel isolation structure DTI (see, e.g., FIG. 2A), which are provided in the photoelectric conversion layer 150. Accordingly, the first connection structure 50 may be electrically connected to the interconnection lines in the interconnection layer 200. The first light-blocking pattern 51 may be formed of or include at least one of metallic materials (e.g., tungsten). The first light-blocking pattern 51 may block light, which is incident into the optical black region OB.

The first conductive pad 81 may be provided in the third trench TR3 to fill a remaining portion of the third trench TR3. The first conductive pad 81 may be formed of or include at least one of metallic materials (e.g., aluminum). The first conductive pad 81 may be connected to the conductive isolation pattern 10 of FIG. 2A. A negative bias voltage may be applied to the conductive isolation pattern 10 through the first conductive pad 81. Accordingly, it may be possible to prevent or suppress a white spot issue or a dark current issue.

The insulating pattern 53 may fill a remaining portion of the fourth trench TR4. The insulating pattern 53 may be provided to penetrate the photoelectric conversion layer 150 and a portion or the entire portion of the interconnection layer 200. The first capping pattern 55 may be provided on a top surface of the insulating pattern 53. The first capping pattern 55 may be provided on the insulating pattern 53.

The bulk color filter 90 may be provided on the first conductive pad 81, the first light-blocking pattern 51, and the first capping pattern 55. The bulk color filter 90 may cover the first conductive pad 81, the first light-blocking pattern 51, and the first capping pattern 55. A first protection layer 71 may be provided on the bulk color filter 90 to seal the bulk color filter 90.

A photoelectric conversion region 110' and a dummy region 111 may be provided on the optical black region OB of the substrate 100. The photoelectric conversion region 110' may be doped with impurities of a second conductivity type different from the first conductivity type. The second conductivity type may be, for example, an n-type. The pixel array region AR may include a plurality of unit pixel regions PX. The dummy region 111 may have a structure similar to the photoelectric conversion region 110' but may not perform the operation of converting light to electric signals, unlike the photoelectric conversion region 110'. The dummy region 111 may be doped with impurities. A signal, which is produced in the dummy region 111, may be used as information for removing a process noise.

A second connection structure 60, a second conductive pad 83, and a second protection layer 73 may be provided on the pad region PR of the substrate 100. The second connection structure 60 may include a second light-blocking pattern 61, an insulating pattern 63, and a second capping pattern 65.

The second light-blocking pattern 61 may be provided on the second surface 100b of the substrate 100. More specifically, the second light-blocking pattern 61 may be provided to cover the anti-reflection layer 42 on the second surface 100b and to conformally cover inner surfaces of fifth and sixth trenches TR5 and TR6. The second light-blocking pattern 61 may be provided to penetrate the photoelectric conversion layer 150 and the upper interconnection layer 221 and to connect the photoelectric conversion layer 150 to the interconnection layer 200. More specifically, the second light-blocking pattern 61 may be in contact with the interconnection lines in the lower interconnection layer 223. Accordingly, the second connection structure 60 may be electrically connected to the interconnection lines in the interconnection layer 200. The second light-blocking pattern 61 may be formed of or include at least one of metallic materials (e.g., tungsten).

The second conductive pad 83 may be provided in the fifth trench TR5 to fill a remaining portion of the fifth trench TR5. The second conductive pad 83 may be formed of or include at least one of metallic materials (e.g., aluminum). The second conductive pad 83 may be used as an electric connection path to the outside of the image sensor device. The insulating pattern 63 may fill a remaining portion of the sixth trench TR6. The insulating pattern 63 may be provided to penetrate the photoelectric conversion layer 150 and the entirety or at least a portion of the interconnection layer 200. The second capping pattern 65 may be provided on the insulating pattern 63. The second protection layer 73 may cover a portion of the second light-blocking pattern 61 and the second capping pattern 65.

A current applied through the second conductive pad 83 may be applied to the conductive isolation pattern 10 of the pixel isolation structure DTI through the second light-blocking pattern 61, the interconnection lines in the interconnection layer 200, the first light-blocking pattern 51. Electrical signals, which are produced in the photoelectric conversion regions 110 and 110' and the dummy region 111, may be transmitted to the outside of the image sensor through the interconnection lines in the interconnection layer 200, the second light-blocking pattern 61, and the second conductive pad 83.

In an image sensor according to an embodiment of the inventive concept, transistors may be appropriately disposed in 3×3 array pixels in such a way to reduce a length of an FD connection line, which is used to connect floating diffusion regions, and to reduce a length of an SF-SEL connection line, which is used to connect a source follower transistor to a selection transistor. Accordingly, it may be possible to reduce a coupling issue between interconnection lines, which are adjacent to the FD connection line and SF-SEL connection line, and thereby to reduce a signal noise issue in the image sensor.

While example embodiments of the inventive concept have been particularly shown and described, it will be understood by one of ordinary skill in the art that variations in form and detail may be made therein without departing from the spirit and scope of the attached claims. The embodiments described with reference to FIGS. 1A to 20 may be combined to realize the inventive concept.

What is claimed is:

1. An image sensor, comprising:
a substrate including a first pixel group and a second pixel group, which are directly adjacent to each other in a first direction, each of the first and second pixel groups comprising first to ninth pixels, which are arranged to form three rows in the first direction and three columns in a second direction, the first to third pixels constituting a first column, the fourth to sixth pixels constituting a second column, and the seventh to ninth pixels constituting a third column;
first to ninth transfer transistors, which are disposed in each of the first and second pixel groups to correspond to the first to ninth pixels, respectively, each of the first to ninth transfer transistors comprising a transfer gate and a floating diffusion region;
a selection transistor disposed in at least one of the fourth to sixth pixels in each of the first and second pixel groups; and
source follower transistors respectively disposed in at least two pixels of the first to third pixels and the seventh to ninth pixels in each of the first and second pixel groups,
wherein source follower gates of the source follower transistors are connected to each other and the floating diffusion region of each of the first to ninth transfer transistors, and
wherein the floating diffusion region of each of the first to ninth transfer transistors disposed in the second pixel group is connected to at least one of the source follower gates disposed in the first pixel group.

2. The image sensor of claim 1, further comprising a dummy transistor, which is disposed in at least one pixel of the first to third pixels and the seventh to ninth pixels in each of the first and second pixel groups.

3. The image sensor of claim 2, wherein the dummy transistor comprises a dummy gate and source/drain regions at both sides thereof, and
a power voltage is applied to all of the dummy gate and the source/drain regions at both sides thereof.

4. The image sensor of claim 1, further comprising:
a first color filter disposed on the first pixel group; and
a second color filter disposed on the second pixel group,
wherein the first and second color filters have different colors from each other.

5. The image sensor of claim 1, wherein a source/drain region of at least one of the source follower transistors disposed in the second pixel group is connected to a source/drain region of the selection transistor disposed in the first pixel group.

6. The image sensor of claim 5, further comprising:
an interlayer insulating layer covering the substrate; and
a connection line, which is disposed on the interlayer insulating layer to connect the source/drain region of the at least one of the source follower transistors in the second pixel group to the source/drain region of the selection transistor in the first pixel group, wherein the connection line has a shape of letter 'H' or 'L', when viewed in a plan view.

7. The image sensor of claim 6, wherein the connection line has a first width in the first or second direction,
each of the first to ninth pixels has a second width in the first or second direction, and
the first width is smaller than the second width.

8. The image sensor of claim 1, further comprising a dual conversion transistor, which is disposed in one of the second, fifth, and sixth pixels in each of the first and second pixel groups.

9. The image sensor of claim 8, further comprising a connection line connecting a source/drain region of the dual conversion transistor in the first pixel group to a source/drain region of the dual conversion transistor in the second pixel group.

10. The image sensor of claim 8, wherein the first to ninth pixels, the first to ninth transfer transistors, the selection transistor, and the source follower transistors of the first pixel group are disposed to be mirror symmetric to the first to ninth pixels, the first to ninth transfer transistors, the selection transistor, and the source follower transistors of the second pixel group,
wherein the dual conversion transistors are respectively disposed in the sixth pixels of the first and second pixel groups,
wherein the image sensor further comprises:
reset transistors respectively disposed in the ninth pixels of the first and second pixel groups;
an interlayer insulating layer covering the first and second pixel groups; and
a connection line, which is disposed on the interlayer insulating layer to connect source/drain regions of the dual conversion transistors in the first and second pixel groups to source/drain regions of the reset transistors in the first and second pixel groups,
wherein a portion of the connection line is extended to regions on the third pixels of the first and second pixel groups.

11. The image sensor of claim 8, wherein the first to ninth pixels, the first to ninth transfer transistors, the selection transistor, and the source follower transistors of the first pixel group are disposed to be mirror symmetric to the first to ninth pixels, the first to ninth transfer transistors, the selection transistor, and the source follower transistors of the second pixel group,
wherein the dual conversion transistors are respectively disposed in the sixth pixels of the first and second pixel groups,
wherein the image sensor further comprises:
reset transistors respectively disposed in the third pixels of the first and second pixel groups;
an interlayer insulating layer covering the first and second pixel groups; and
a connection line, which is disposed on the interlayer insulating layer to connect source/drain regions of the dual conversion transistors in the first and second pixel groups to source/drain regions of the reset transistors in the first and second pixel groups,
wherein the connection line has a square or rectangular shape, when viewed in a plan view.

12. The image sensor of claim 1, wherein the third, sixth, and ninth pixels of the first pixel group are directly adjacent to the first, fourth, and seventh pixels of the second pixel group,
wherein the image sensor further comprises:

a first selection transistor disposed in the fourth pixel of the second pixel group;
a second selection transistor disposed in the sixth pixel of the first pixel group; and
an output line connecting a source/drain region of the first selection transistor to a source/drain region of the second selection transistor,
wherein an electrical signal produced in the second pixel group is transmitted to the output line by the first and second selection transistors.

13. An image sensor, comprising:
a substrate including a first pixel group and a second pixel group, which are directly adjacent to each other in a first direction, each of the first and second pixel groups comprising first to ninth pixels, which are arranged to form three rows in the first direction and three columns in a second direction, the first to third pixels constituting a first column, the fourth to sixth pixels constituting a second column, and the seventh to ninth pixels constituting a third column;
first to ninth transfer transistors, which are disposed in each of the first and second pixel groups to correspond to the first to ninth pixels, respectively, each of the first to ninth transfer transistors comprising a transfer gate and a floating diffusion region;
a selection transistor disposed in at least one of the fourth to sixth pixels in each of the first and second pixel groups; and
a dummy transistor disposed in at least one pixel of the first to third pixels and the seventh to ninth pixels in each of the first and second pixel groups.

14. The image sensor of claim 13, wherein the dummy transistor comprises a dummy gate and source/drain regions at both sides thereof, and
a power voltage is applied to all of the dummy gate and the source/drain regions at both sides thereof.

15. The image sensor of claim 13, further comprising:
source follower transistors respectively disposed in at least two pixels of the first to third pixels and the seventh to ninth pixels in each of the first and second pixel groups;
an interlayer insulating layer covering the substrate; and
a connection line, which is disposed on the interlayer insulating layer to connect the floating diffusion region of each of the first to ninth transfer transistors to source follower gates of the source follower transistors.

16. An image sensor, comprising:
a substrate including a first pixel group and a second pixel group, which are directly adjacent to each other in a first direction, each of the first and second pixel groups comprising first to ninth pixels, which are arranged to form three rows in the first direction and three columns in a second direction, the first to third pixels constituting a first column, the fourth to sixth pixels constituting a second column, and the seventh to ninth pixels constituting a third column;
a deep device isolation structure disposed in the substrate to isolate the first to ninth pixels from each other and to isolate the first and second pixel groups from each other;
first to ninth transfer transistors, which are disposed in each of the first and second pixel groups to correspond to the first to ninth pixels, respectively, each of the first to ninth transfer transistors comprising a transfer gate and a floating diffusion region;

source follower transistors respectively disposed in at least two pixels of the first to third pixels and the seventh to ninth pixels in each of the first and second pixel groups;
an interlayer insulating layer covering the first to ninth transfer transistors and the source follower transistors;
a first connection line disposed on the interlayer insulating layer to connect source follower gates of the source follower transistors to the floating diffusion region of each of the first to ninth transfer transistors; and
a first color filter and a second color filter, which cover the first and second pixel groups, respectively, and have different colors from each other.

17. The image sensor of claim 16, further comprising:
a selection transistor disposed in at least one of the fourth to sixth pixels; and
a dummy transistor disposed in at least one pixel of the first to third pixels and the seventh to ninth pixels.

18. The image sensor of claim 16, wherein the floating diffusion region of each of the first to ninth transfer transistors disposed in the second pixel group is connected to at least one of the source follower gates disposed in the first pixel group.

19. The image sensor of claim 16, further comprising:
a selection transistor disposed in at least one of the fourth to sixth pixels in each of the first and second pixel groups; and
a second connection line, which is disposed on the interlayer insulating layer to connect a source/drain region of at least one of the source follower transistors in the second pixel group to a source/drain region of the selection transistor in the first pixel group,
wherein the second connection line has a shape of letter 'H' or 'L', when viewed in a plan view.

* * * * *